(12) United States Patent
Kumagai et al.

(10) Patent No.: US 9,551,068 B2
(45) Date of Patent: Jan. 24, 2017

(54) FILM FORMING METHOD AND FILM FORMING APPARATUS

(71) Applicant: TOKYO ELECTRON LIMITED, Tokyo (JP)

(72) Inventors: Takeshi Kumagai, Oshu (JP); Muneyuki Otani, Oshu (JP); Kazuya Okubo, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/694,200

(22) Filed: Apr. 23, 2015

(65) Prior Publication Data

US 2015/0315705 A1   Nov. 5, 2015

(30) Foreign Application Priority Data

May 1, 2014   (JP) .................................. 2014-094683

(51) Int. Cl.

| | |
|---|---|
| *C23C 16/455* | (2006.01) |
| *H01J 37/32* | (2006.01) |
| *H01L 21/311* | (2006.01) |
| *C23C 16/40* | (2006.01) |
| *C23C 16/50* | (2006.01) |
| *C23C 16/458* | (2006.01) |

(52) U.S. Cl.
CPC .............. *C23C 16/40* (2013.01); *C23C 16/458* (2013.01); *C23C 16/45536* (2013.01); *C23C 16/45544* (2013.01); *C23C 16/45551* (2013.01); *C23C 16/50* (2013.01); *H01J 37/32009* (2013.01); *H01J 37/3244* (2013.01); *H01J 37/32091* (2013.01); *H01J 37/32733* (2013.01); *H01J 37/32899* (2013.01)

(58) Field of Classification Search
None
See application file for complete search history.

(56) References Cited

U.S. PATENT DOCUMENTS

| | | | |
|---|---|---|---|
| 2006/0043504 A1* | 3/2006 | Ahn .................... | C23C 16/0281 257/410 |
| 2011/0159188 A1* | 6/2011 | Kato ...................... | C23C 16/34 427/255.394 |

(Continued)

FOREIGN PATENT DOCUMENTS

JP           2002-50622 A       2/2002

*Primary Examiner* — Shamim Ahmed

(74) *Attorney, Agent, or Firm* — Nath, Goldberg & Meyer; Jerald L. Meyer

(57) ABSTRACT

A film forming method includes supplying a first source gas containing a first metal element onto a substrate, supplying a second source gas containing a second metal element onto the substrate, supplying a reaction gas converted into plasma and containing a nonmetal element reacting with the first metal element and the second metal element to generate a first reaction product and a second reaction product, respectively, to the substrate, to generate a third reaction product containing the first metal element, the second metal element and the nonmetal element. A mixing ratio of the first metal element contained in the third reaction product is higher than that of the second metal element, and a crystallization temperature of the second reaction product is higher than that of the first reaction product.

11 Claims, 17 Drawing Sheets

(56) References Cited

U.S. PATENT DOCUMENTS

| | | | |
|---|---|---|---|
| 2012/0264281 A1* | 10/2012 | Chen | H01L 21/823437 438/591 |
| 2012/0276305 A1* | 11/2012 | Hamalainen | C23C 16/08 427/569 |
| 2015/0093911 A1* | 4/2015 | Nakatani | C23C 16/52 438/761 |
| 2015/0255267 A1* | 9/2015 | Tapily | H01L 21/0228 438/763 |
| 2015/0299848 A1* | 10/2015 | Haukka | C23C 16/18 427/123 |

* cited by examiner

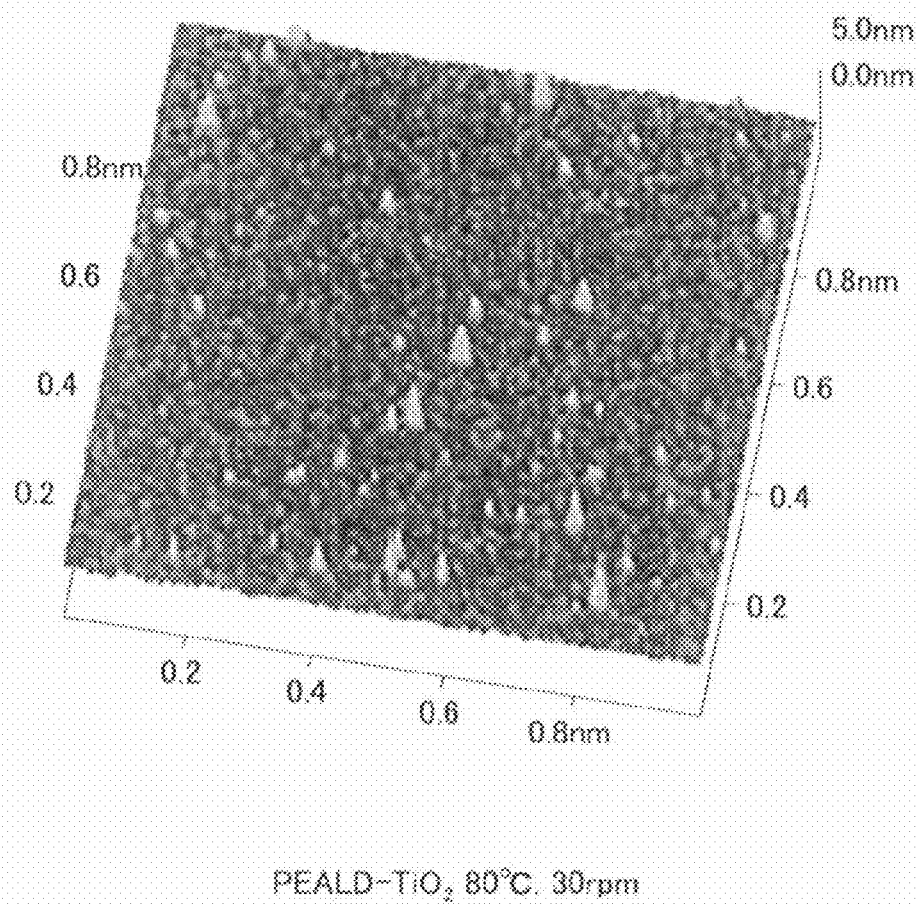

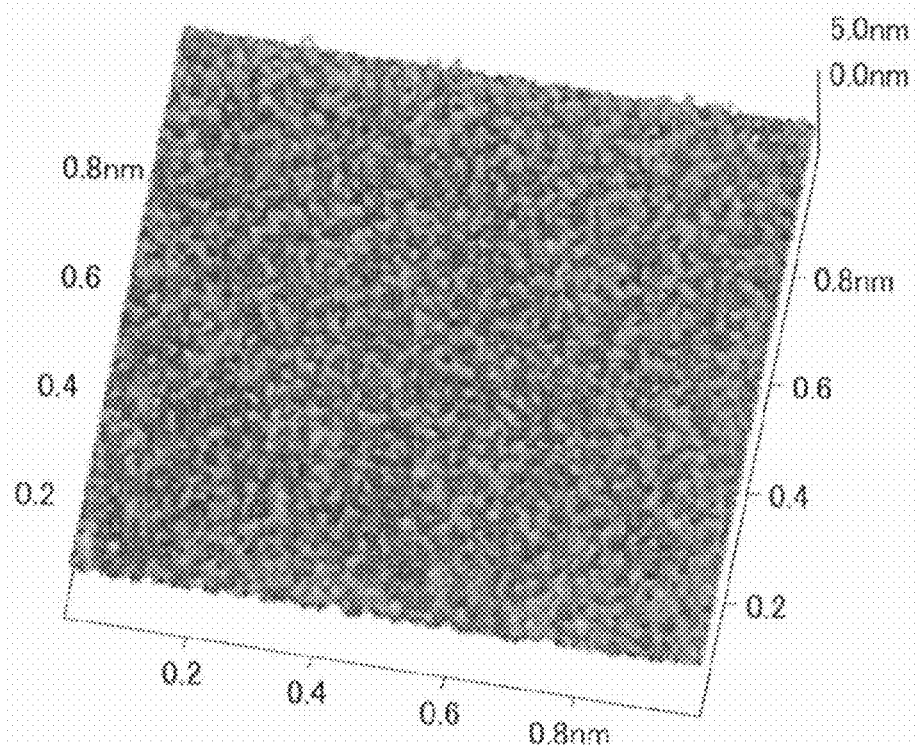

FILM FORMING METHOD AND FILM FORMING APPARATUS

CROSS-REFERENCE TO RELATED APPLICATION

This application claims the benefit of Japanese Patent Application No. 2014-094683, filed on May 1, 2014, in the Japan Patent Office, the disclosure of which is incorporated herein in its entirety by reference.

TECHNICAL FIELD

The present disclosure relates to a film forming method and a film forming apparatus.

BACKGROUND

In a conventional method of modifying a metal oxide film formed on a surface of a substrate by using a modifying gas generated by exciting an $O_2$ gas by plasma, a method of modifying a metal oxide film by setting a temperature of a substrate during modification to a temperature ranging from room temperature to a temperature lower than a temperature at which the metal oxide film is crystallized, and then crystallizing the metal oxide film as necessary has been known.

Further, a method of modifying a metal oxide film by setting a temperature of a substrate during modification to a temperature higher than a temperature at which the metal oxide film is crystallized to thereby simultaneously perform modification and crystallization has also been disclosed.

However, the purpose of film formation is not limited to the formation of an electronic circuit, and film formation may be performed to manufacture a hard mask for forming a pattern. In this case, a technology of forming a film with a smooth surface having low surface roughness, rather than a film having a rough surface due to crystallization is required.

SUMMARY

Some embodiments of the present disclosure provide a film forming method and a film forming apparatus, which are capable of forming a film with a surface not crystallized and having low surface roughness.

According to one embodiment of the present disclosure, provided is a film forming method including: supplying a first source gas containing a first metal element onto a substrate; supplying a second source gas containing a second metal element onto the substrate; supplying a reaction gas converted into plasma and containing a nonmetal element reacting with the first metal element and the second metal element to generate a first reaction product and a second reaction product, respectively, to the substrate, to generate a third reaction product containing the first metal element, the second metal element and the nonmetal element, wherein a mixing ratio of the first metal element contained in the third reaction product is higher than that of the second metal element, and a crystallization temperature of the second reaction product is higher than that of the first reaction product.

According to one embodiment of the present disclosure, provided is a film forming apparatus including: a process container; a rotary table installed in the process container to load a substrate thereon; first and second process regions formed to be spaced apart from each other on the rotary table along a rotational direction of the rotary table; first and second source gas supply units installed to supply different kinds of first and second source gases separately in the first process region; a reaction gas supply unit installed to supply a reaction gas reacting with the first and the second source gases within the second process region to generate first and second reaction products, respectively; and a plasma generation mechanism configured to generate plasma of the reaction gas.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 15A and 15B are views illustrating the result of performing the film forming method according to an embodiment of the present disclosure, where FIG. 15A is a view illustrating the result of performing the conventional film forming method and FIG. 15B is a view illustrating the result of performing the film forming method according to the present embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Hereinafter, specific embodiments of the present disclosure will be described with reference to the drawings. First, a film forming apparatus as an example of an embodiment of the present disclosure will be described with reference to FIGS. 1 to 12.

(Film Forming Apparatus)

Figure 1:
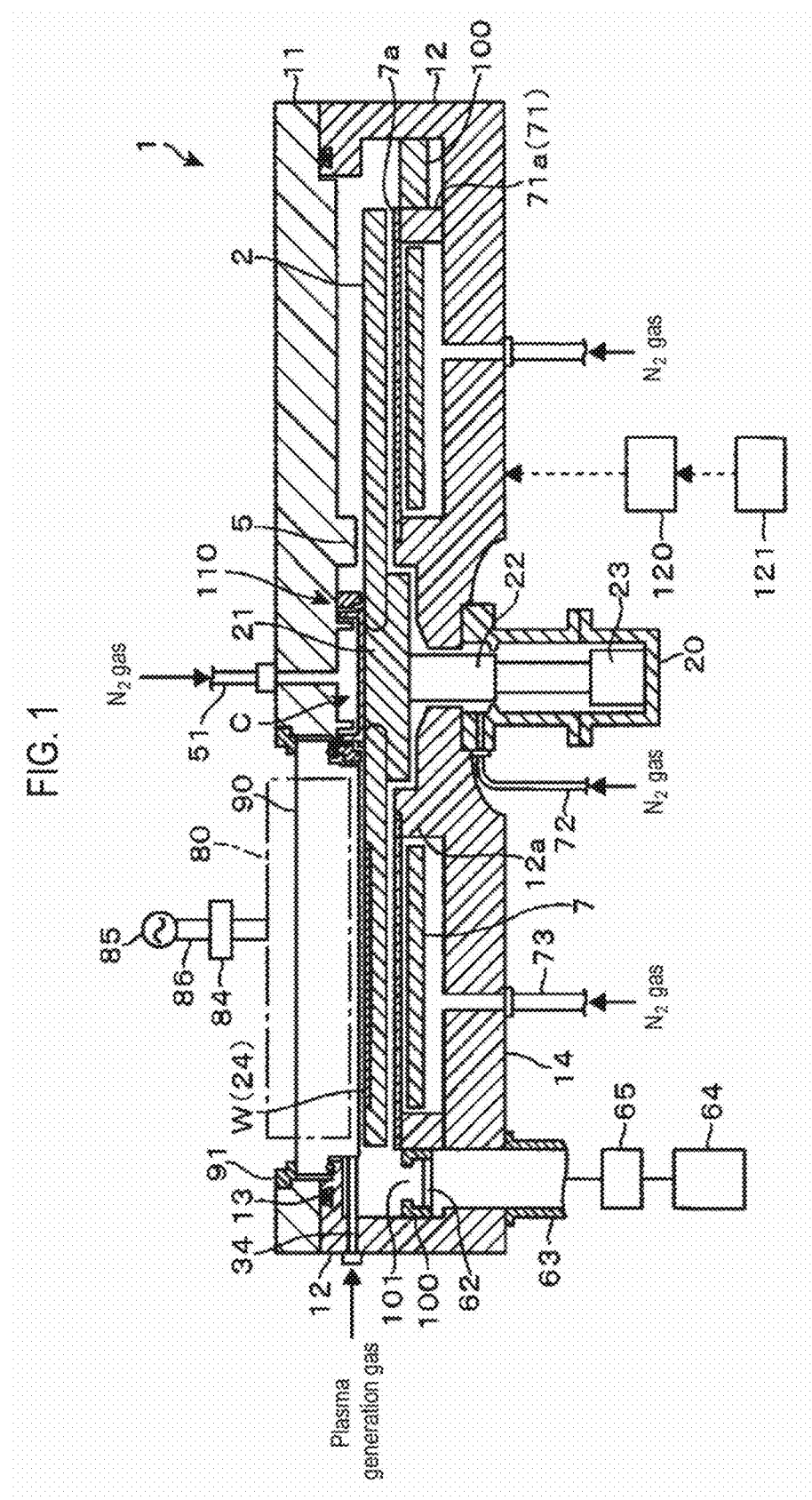
FIG. 1 is a longitudinal-sectional view illustrating an example of a film forming apparatus according to an embodiment of the present disclosure.
Figure 2:
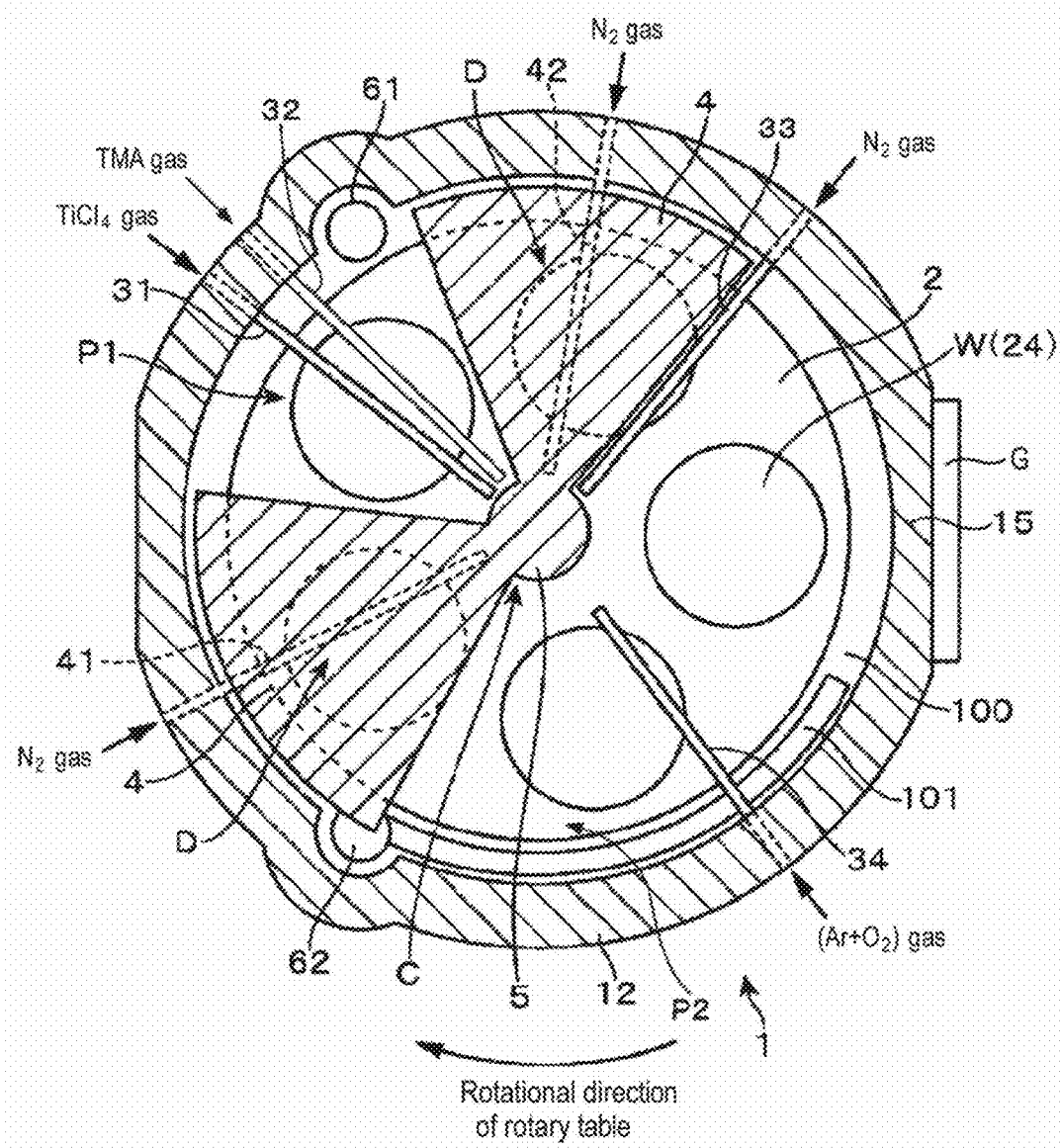
FIGS. 2 and 3 are cross-sectional views illustrating an example of a film forming apparatus according to an embodiment of the present disclosure.

As illustrated in FIGS. 1 and 2, a film forming apparatus according to an embodiment of the present disclosure includes a vacuum container 1 whose plane shape is substantially circular, and a rotary table 2 that is a loading table installed within the vacuum container 1 and having a rotation center coinciding with the center of the vacuum container 1. Further, in this film forming apparatus, as described in detail later, a thin film is formed by stacking a reaction product on a surface of a wafer W having, e.g., a diameter of 300 mm through atomic layer deposition (ALD), and plasma modification on the thin film is performed. In performing plasma modification, a film forming process is performed such that a surface of the thin film is not crystallized and roughened by plasma. The film forming apparatus is configured to realize such a film forming process. Hereinafter, each component of the film forming apparatus will be described in detail.

The vacuum container 1 includes a ceiling plate 11 and a container body 12, and it is configured such that the ceiling plate 11 is detachably attached to the container body 12. A separation gas supply pipe 51 for supplying an $N_2$ (nitrogen) gas as a separation gas is connected to a central portion of the upper surface side of the ceiling plate 11 in order to restrain different process gases from being mixed in the central region C of the vacuum container 1. A sealing member 13, e.g., an O-ring is installed in a ring shape along a peripheral portion of an upper surface of the container body 12.

The rotary table 2 is fixed to a core part 21 having a substantially cylindrical shape in the central portion and is rotatable about a vertical axis in a clockwise direction in this example by a rotation shaft 22 connected to a lower surface of the core part 21 and extending in the vertical direction. Referring to FIG. 1, a driving unit 23 rotating the rotation shaft 22 about the vertical axis and a case body 20 for receiving the rotation shaft 22 and the driving unit 23 are installed. The case body 20 is airtightly installed on a lower surface of a bottom portion 14 of the vacuum container 1 at a flange portion of an upper side of the case body 20. Further, a purge gas supply pipe 72 for supplying an $N_2$ gas as a purge gas to a lower region of the rotary table 2 is connected to the case body 20. A bottom portion 14 of the vacuum container 1 at an outer circumferential side of the core part 21 forms a protrusion portion 12a having a ring shape and protruding in a direction toward the rotary table 2.

Figure 3:
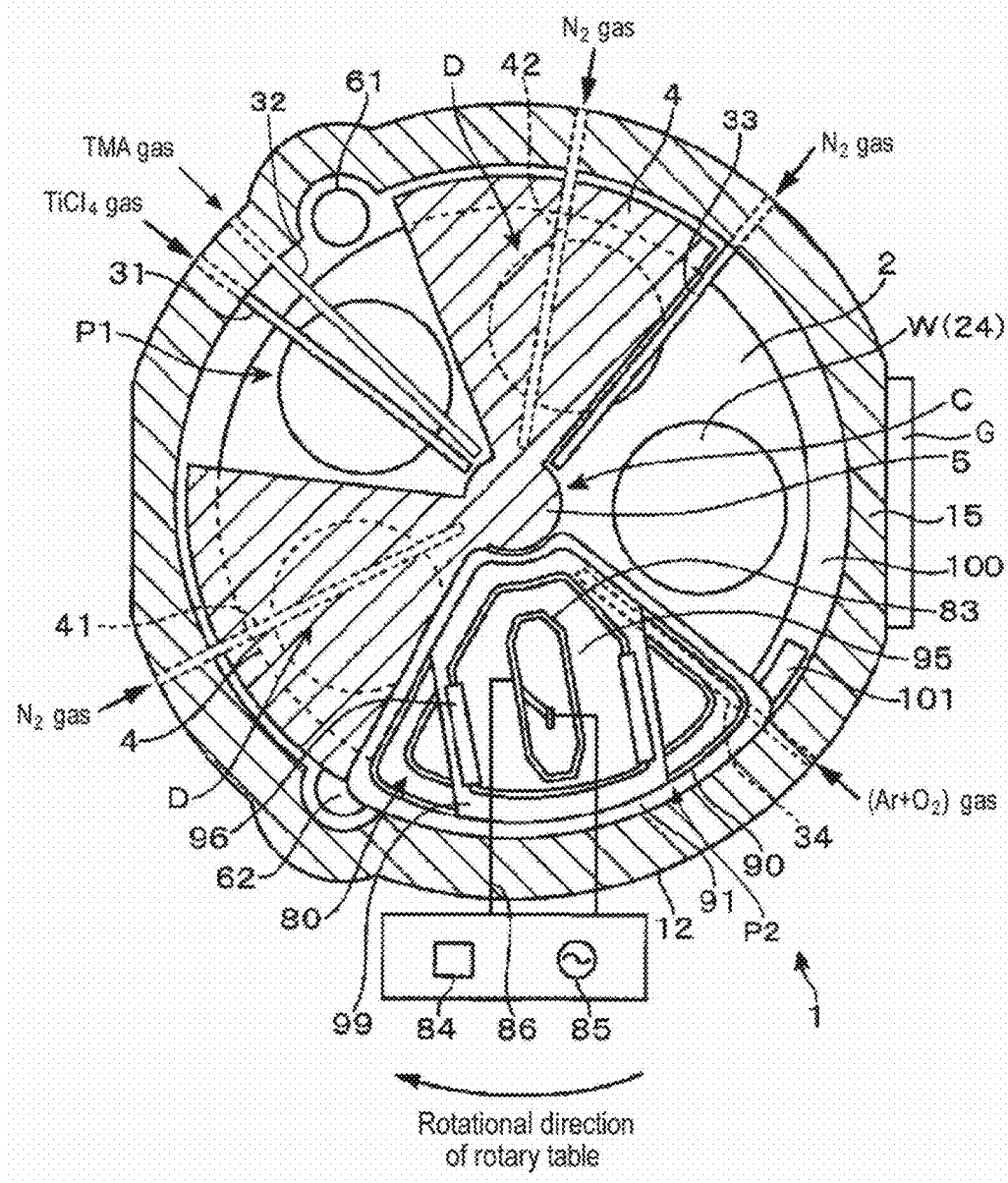

As illustrated in FIGS. 2 and 3, circular concave portions 24 for mounting thereon a plurality of wafers W, e.g., five wafers W as substrates along a rotational direction (circumferential direction), are formed as substrate loading regions on a surface portion of the rotary table 2. The concave portions 24 are set to have dimensions of a diameter and a depth such that the surfaces of the wafers W and the surface of the rotary table 2 (the region where the wafers W are not loaded) become flushed with each other when the wafers W are placed (received) in the concave portions 24. Through holes (not shown) through which, e.g., three lifting pins described later penetrate, are formed on lower surfaces of the concave portions 24 in order to push up and lift the wafers W from below.

As illustrated in FIGS. 2 and 3, six nozzles 31, 32, 33, 34, 41, and 42 each formed of, e.g., quartz, are disposed radially and spaced apart from one another in a circumferential direction (rotational direction of the rotary table 2) of the vacuum container 1, facing regions of the concave portions 24 in the rotary table 2. The nozzles 31, 32, 33, 34, 41, and 42 are each installed to extend horizontally, e.g., from an outer circumferential wall of the vacuum container 1 toward the central region C while facing the wafers W. In this example, a plasma generation gas nozzle 34, a separation gas nozzle 41, a first process gas nozzle 31, a second process gas nozzle 32, a separation gas nozzle 42, and a third process gas nozzle 33 are arranged in this order in a clockwise direction (rotational direction of the rotary table 2) when viewed from a transfer port 15 described later. As illustrated in FIG. 1, a plasma generating unit 80 is installed above the plasma generation gas nozzle 34 in order to generate plasma of a reaction gas discharged from the plasma generation gas nozzle 34. The plasma generating unit 80 will be described in detail later.

The process gas nozzles 31 and 32 form a first process gas supply unit and a second process gas supply unit, respectively, and the separation gas nozzles 41 and 42 each form a separation gas supply unit. In particular, the first process gas supply unit 31 and the second process gas supply unit 32 supply a first source gas and a second source gas, respectively, and thus, the first process gas supply unit 31 and the second process gas supply unit 32 may also be called a first source gas supply unit 31 and a second source gas supply unit 32, respectively. Further, since the plasma generation gas nozzle 34 supplies a reaction gas that reacts with the first and second source gases, the plasma generation gas nozzle 34 may also be called a reaction gas supply unit 34. The process gas nozzle 33 is installed to supply a reaction gas such as an oxidizing gas or a nitriding gas (e.g., an ammonia gas) depending on processes, and here, since such gases are not necessary in the film forming process of the film forming method according to an embodiment of the present disclosure, the process gas nozzle 33 supplies an $N_2$ gas as an inert gas, like the separation gas nozzles 41 and 42.

Further, FIG. 2 illustrates a state in which the plasma generating unit 80 and a housing 90 described later are removed such that the plasma generation gas nozzle 34 is visible, and FIG. 3 illustrates a state in which the plasma generating unit 80 and the housing 90 are installed. Further, in FIG. 1, the plasma generating unit 80 is schematically denoted by a dashed dotted line.

The nozzles 31, 32, 33, 34, 41, and 42 are connected to gas supply sources (not shown) set forth below through flow rate adjusting valves, respectively. That is, the first process gas nozzle 31 is connected to a supply source of a first process gas containing titanium (Ti) as a first metal element, e.g., titanium tetrachloride (TiCl$_4$) gas, or the like. The second process gas nozzle 32 is connected to a supply source of, e.g., a trimethylaluminum (TMA) gas containing aluminum (Al) as a second metal element. The third process gas nozzle 33 is connected to a supply source of a nitrogen (N$_2$) gas as an inert gas. The plasma generation gas nozzle 34 is connected to a supply source of a mixture of, e.g., an argon (Ar) gas and an oxygen (O$_2$) gas. The separation gas nozzles 41 and 42 are each connected to a gas supply source of a nitrogen (N$_2$) gas as a separation gas.

On a lower side of the nozzles 31, 32, 33, 41, and 42, gas discharge holes 35 (see FIG. 7) are formed, for example, at equal intervals, in a plurality of portions in a radial direction of the rotary table 2. On the side of the plasma generation gas nozzle 34, gas discharge holes 35 (see FIG. 7) are formed, for example, at equal intervals, in a plurality of portions in a longitudinal direction of the plasma generation gas nozzle 34, such that the gas discharge holes 35 face an upstream side of the rotational direction of the rotary table 2 (the second process gas nozzle 32 side) and, at the same time, downwardly (obliquely downwardly).

A region below the process gas nozzles 31 and 32 is a first process region P1 for making a Ti-containing gas and an Al-containing gas adsorbed to the wafers W, while a region below the plasma generation gas nozzle 34 is a second process region P2 for reacting the Ti-containing gas and the Al-containing gas adsorbed to the wafers W with the O$_2$ gas plasma. The separation gas nozzles 41 and 42 each serve to form a separation region D that separates the first process region P1 and the second process region P2. As illustrated in FIGS. 2 and 3, a substantially fan-shaped convex configuration portion 4 is formed in the ceiling plate 11 of the vacuum container 1 in the separation region D, and the separation gas nozzles 41 and 42 are accommodated within a recess portion 43 formed in the convex portion 4. Thus, on both sides of the separation gas nozzles 41 and 42 in a circumferential direction of the rotary table 2, a lower ceiling surface 44 (first ceiling surface) that is a lower surface of the convex portion 4 is disposed, and on both sides of the ceiling surface 44 in the circumferential direction, a ceiling surface 45 (second ceiling surface) higher than the ceiling surface 44 is disposed, in order to restrain each process gas and the reaction gas from being mixed. A peripheral portion of the convex portion 4 (portion of an outer periphery side of the vacuum container 1) is bent to have an L shape such that it faces an outer end surface of the rotary table 2 and is slightly spaced apart from the container body 12, in order to restrain each process gas and the reaction gas from being mixed.

Here, the process gas nozzle 31 for supplying a TiCl$_4$ gas as a first source gas onto the wafers W and the process gas nozzle 32 for supplying a TMA gas as a second source gas onto the wafers W are installed to be adjacent in the first process region P1. The TiCl$_4$ gas and the TMA gas are simultaneously supplied onto the wafers W within the first process region P1, and the two source gases are adsorbed to the wafers W. Further, the two source gases are oxidized by an oxidizing gas (e.g., an O$_2$ gas, an O$_3$ gas, or the like) converted into plasma to generate TiAlO in the second process region P2. Thus, the film forming apparatus according to the present embodiment has a configuration very advantageous to generation of an alloy film.

Further, the first process gas nozzle 31 and the second process gas nozzle 32 may be formed to have a different configuration easy to supply the first source gas and the second source gas, respectively. For example, the first process gas nozzle 31 for supplying the TiCl$_4$ gas has a larger number of gas discharge holes 35 in a proximal portion thereof to correspond to the radially outer side of the rotary table 2 having a higher rotation speed, whereas the second process gas nozzle for supplying the TMA gas may be formed to have a larger number of gas discharge holes 35 on a distal portion thereof. Further, in case of an alloy film as a final product, when a plurality of process gas nozzles is individually installed for the source gases containing a metal element that forms the alloy, which can be classified by kinds, rather than supplying a mixture gas through a single process gas nozzle, nozzle shapes can be fitted according to the characteristics of the gases, whereby source gases may be smoothly and appropriately supplied. Here, the nozzle shapes include factors such as a size of the gas discharge holes 35 (diameter of the holes), positions, distribution density and the like, and these factors can be variously fitted into kinds and qualities of gases.

Further, the positions and number of the distributed gas discharge holes 35 in the factors of the nozzle shapes can be determined based on the in-plane tendency of a film thickness of a film formed on the wafers W. In this manner, when different kinds of source gases are supplied from individual gas nozzles 31 and 32, the gas nozzles 31 and 32 may be properly configured to have appropriate shapes in consideration of the properties of the gas being supplied, in-plane film thickness on the wafers W, and the like.

Figure 4:
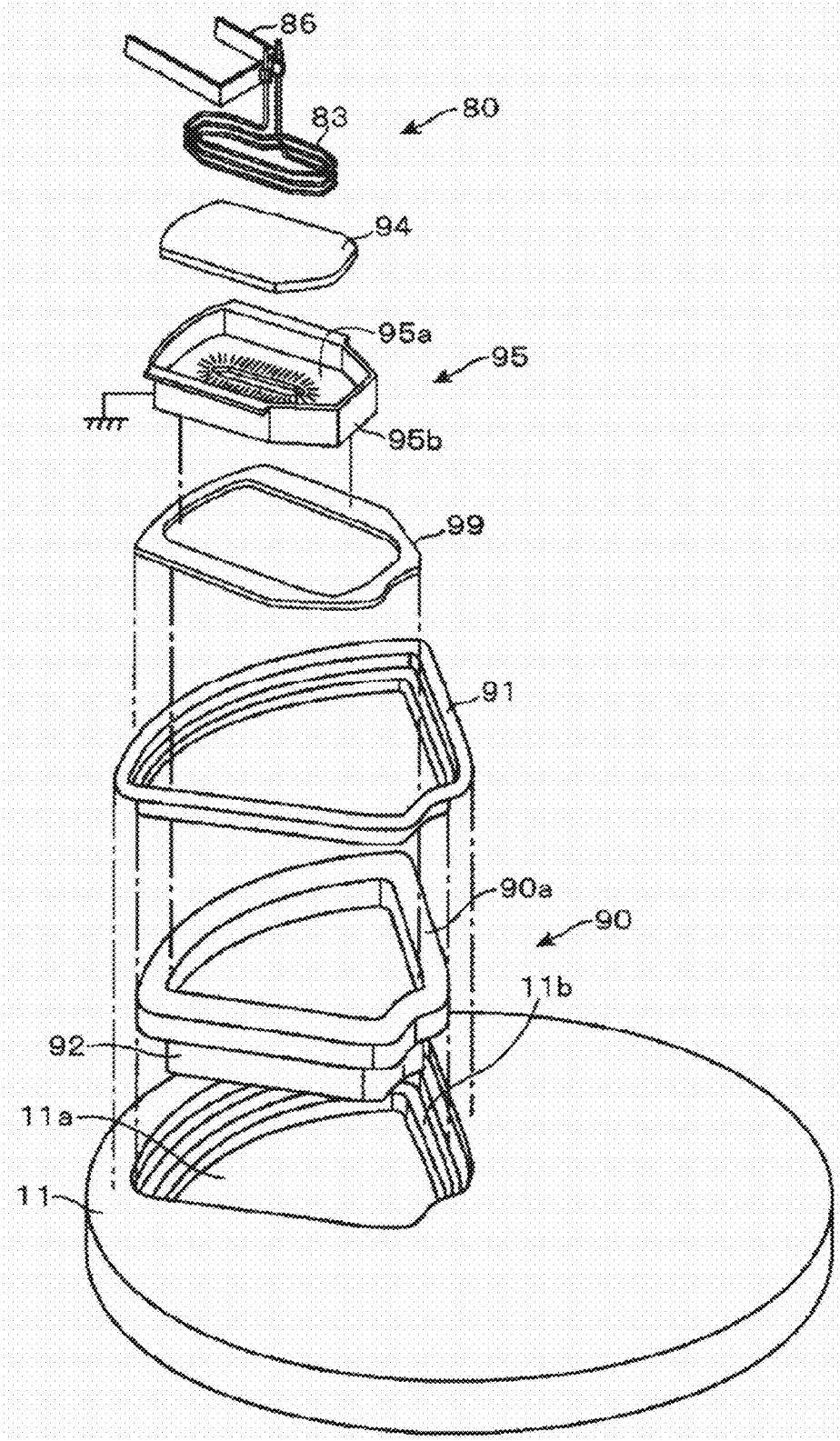
FIG. 4 is an exploded perspective view illustrating a portion of the interior of an example of the film forming apparatus according to an embodiment of the present disclosure.

Subsequently, the plasma generating unit 80 will be described in detail. The plasma generating unit 80 is configured by winding an antenna 83 formed of a metal line in a coil shape and installed on the ceiling plate 11 of the vacuum container 1 so as to be airtightly partitioned from the inner region of the vacuum container 1. In this example, the antenna 83 is formed by, for example, performing nickel plating and gold plating on a surface of copper (Cu) in this order. As illustrated in FIG. 4, an opening 11a opened to have a substantially fan shape when viewed from a plane is formed in the ceiling plate 11 on an upper side of the aforementioned plasma generation gas nozzle 34 (specifically, from a position at a slight upstream side of the nozzle 34 in a rotational direction of the rotary table 2 to a position biased toward the nozzle 34 from the separation region D at a downstream side of the nozzle 34 in the rotational direction).

Figure 5:
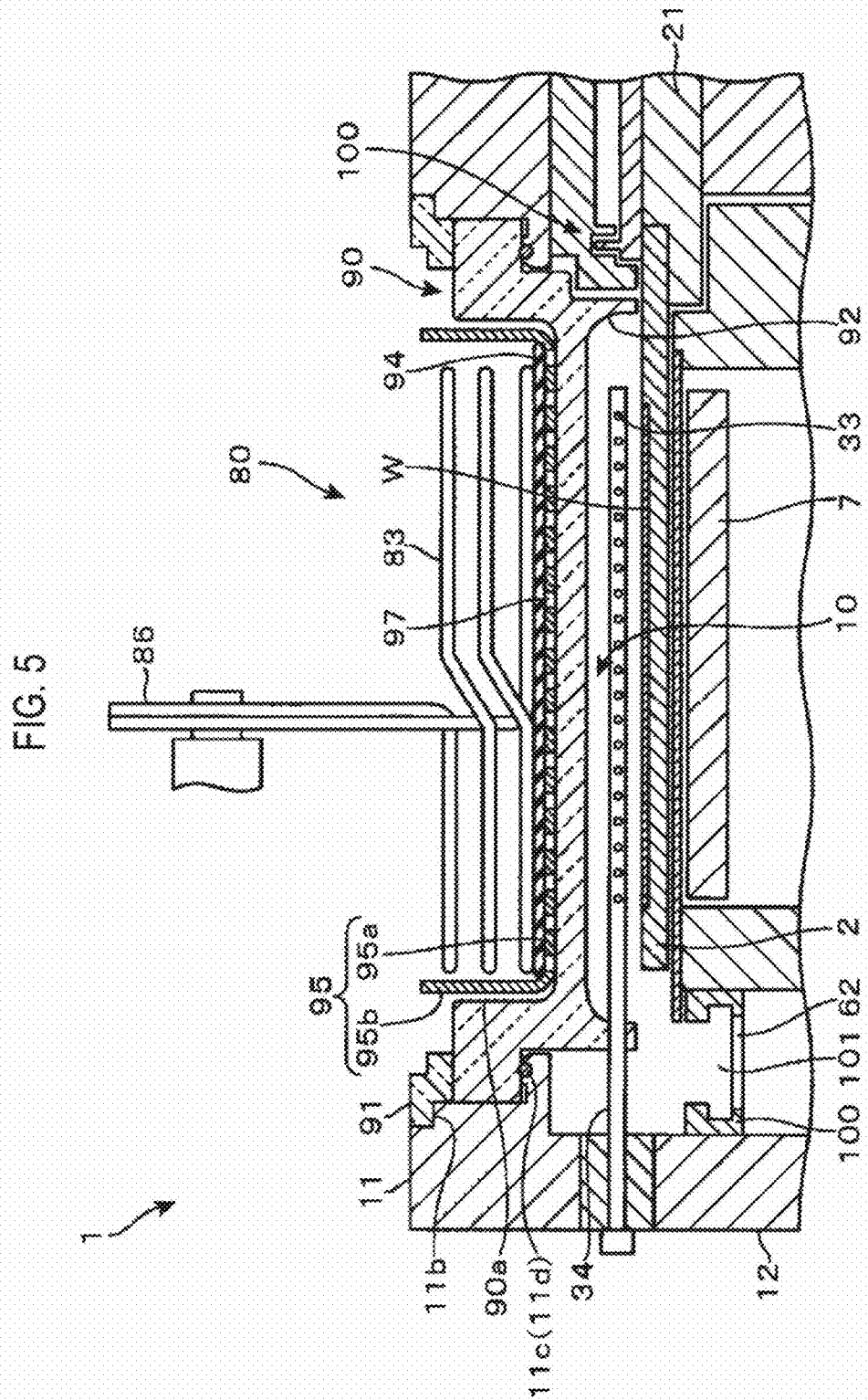
FIG. 5 is a longitudinal-sectional view illustrating a portion of the interior of an example of the film forming apparatus according to an embodiment of the present disclosure.

The opening 11a is formed over a region from a position radially outwardly spaced apart, e.g., about 60 mm, from the rotation center of the rotary table 2 to a position radially outwardly spaced apart, about 80 mm, from an outer edge of the rotary table 2. Further, the opening 11a is formed to have a concave circular arc shape at an end thereof facing the center of the rotary table 2, when viewed in a plane, which conforms to a peripheral portion of a labyrinth structure portion 110 installed in the central region C of the vacuum container 1 as described later, so that the opening 11a is not interfered (can avoid interference) with the labyrinth structure portion 110. Further, as illustrated in FIGS. 4 and 5, for example, three-stage step portions 11b are formed in a circumferential direction in the opening 11a such that a diameter of the opening 11a is reduced by stages from the upper surface side of the ceiling plate 11 toward a lower surface side thereof. As illustrated in FIG. 5, a recess 11c is formed on an upper surface of the lowermost step portion (opening edge portion) among these step portions 11b, in a circumferential direction, and a seal member, e.g., an O-ring 11d, is disposed in the recess 11c. Further, the recess 11c and the O-ring 11d are not illustrated in FIG. 4.

Figure 6:
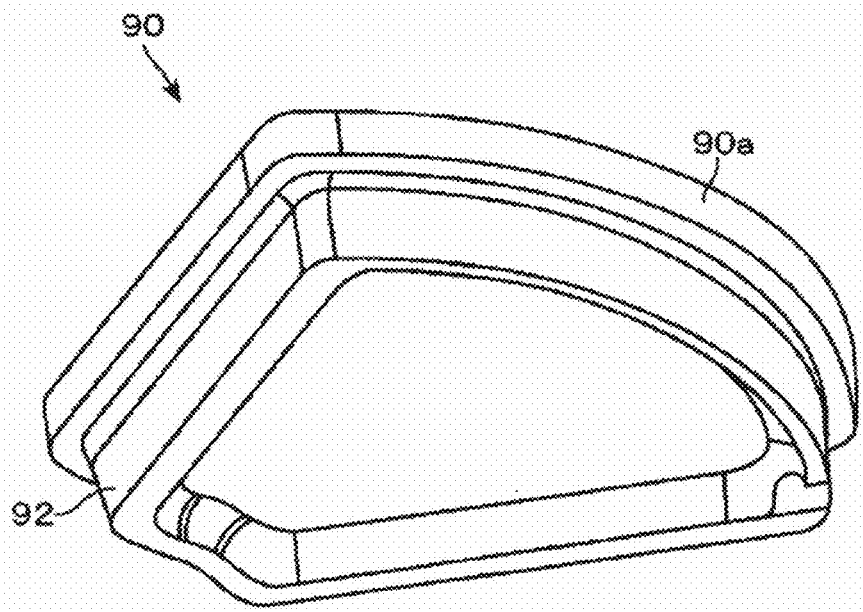
FIG. 6 is a perspective view illustrating a portion of the interior of an example of the film forming apparatus according to an embodiment of the present disclosure.
Figure 10:
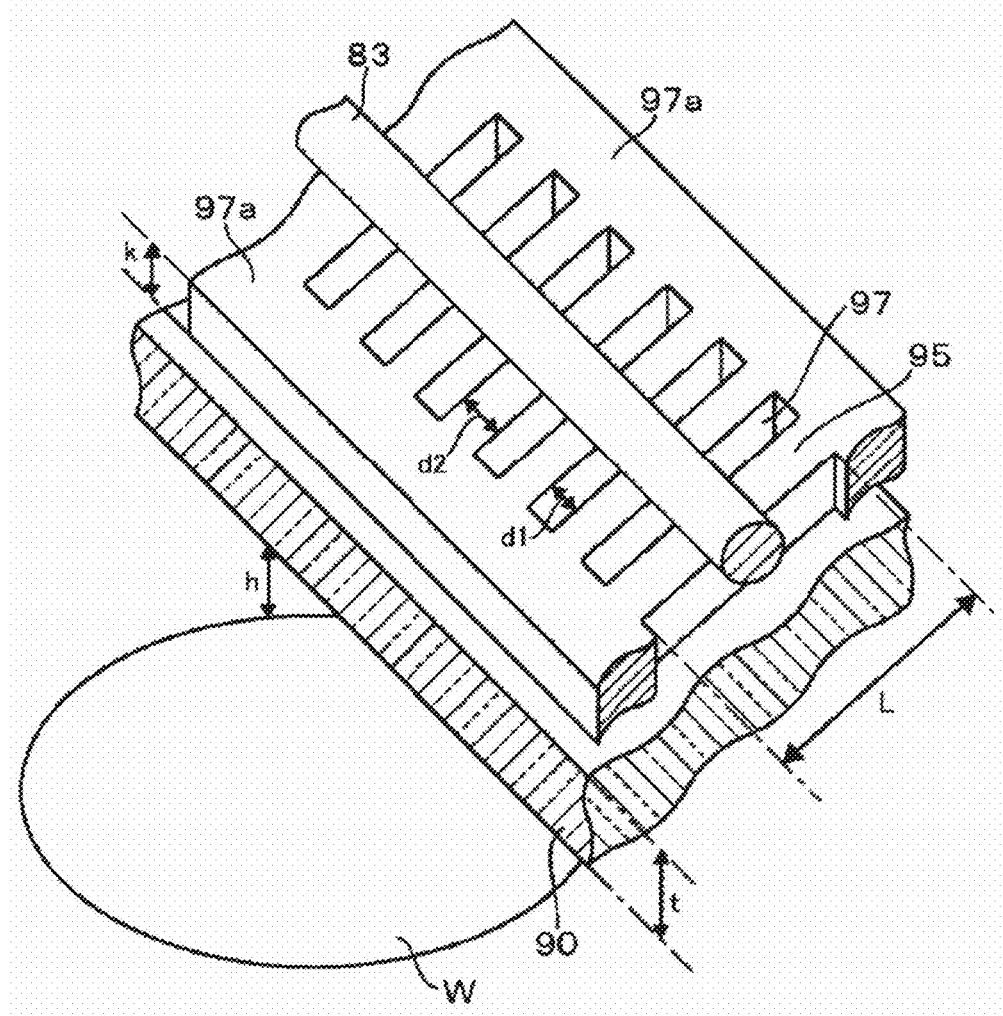
FIG. 10 is a perspective view illustrating a portion of the Faraday shield of an example of the film forming apparatus according to an embodiment of the present disclosure.

As illustrated in FIG. 6, the housing 90 is disposed in the opening 11*a*. The housing is formed such that a peripheral portion of an upper side horizontally extends in the circumferential direction to form a flange portion 90*a* and a central portion is formed to be concave toward an inner region of the vacuum container 1 of a lower side. In order to make a magnetic field generated by the plasma generating unit 80 reach the interior of the vacuum container 1, the housing 90 is formed of a magnetically permeable material (material allowing magnetic force to penetrate therethrough) such as a dielectric material such as, e.g., quartz, and as illustrated in FIG. 10, a thickness dimension t of the concave portion is, e.g., 20 mm. Further, the housing 90 is configured such that, when the wafer W is positioned below the housing 90, a distance between an inner wall surface of the housing 90 at the central region C side and a peripheral portion of the wafer W is 70 mm, and a distance between an inner wall surface of the housing 90 at a periphery side of the rotary table 2 and the peripheral portion of the wafer W is 70 mm. Further, an angle α between two sides of the opening 11*a* on the upstream side and the downstream side in the rotational direction of the rotary table 2 with the rotation center of the rotary table 2 is, e.g., 68°.

When the housing 90 falls into the opening 11*a*, the flange portion 90*a* and the lowermost step portion among the step portions 11*b* are caught to each other. Further, the lowermost step portion among the step portions 11*b* (the ceiling plate 11) and the housing 90 are airtightly connected by the O-ring 11*d*. Further, while the flange portion 90*a* is pressed downwardly over the circumference thereof by a pressing member 91 formed to have a frame shape conforming to a peripheral portion of the opening 11*a*, the pressing member 91 is fixed to the ceiling plate 11 by a bolt (not shown), or the like, whereby an internal atmosphere of the vacuum container 1 becomes airtight. When the housing 90 is airtightly fixed to the ceiling plate 11 in this manner, a separation dimension h between a lower surface of the housing 90 and the surface of the wafer W on the rotary table 2 is 4 to 60 mm, and set to 30 mm in this example. Further, FIG. 6 illustrates the housing 90 viewed from a lower side thereof. Further, in FIG. 10, a portion of the housing 90 or the like is enlargedly depicted.

Figure 7:
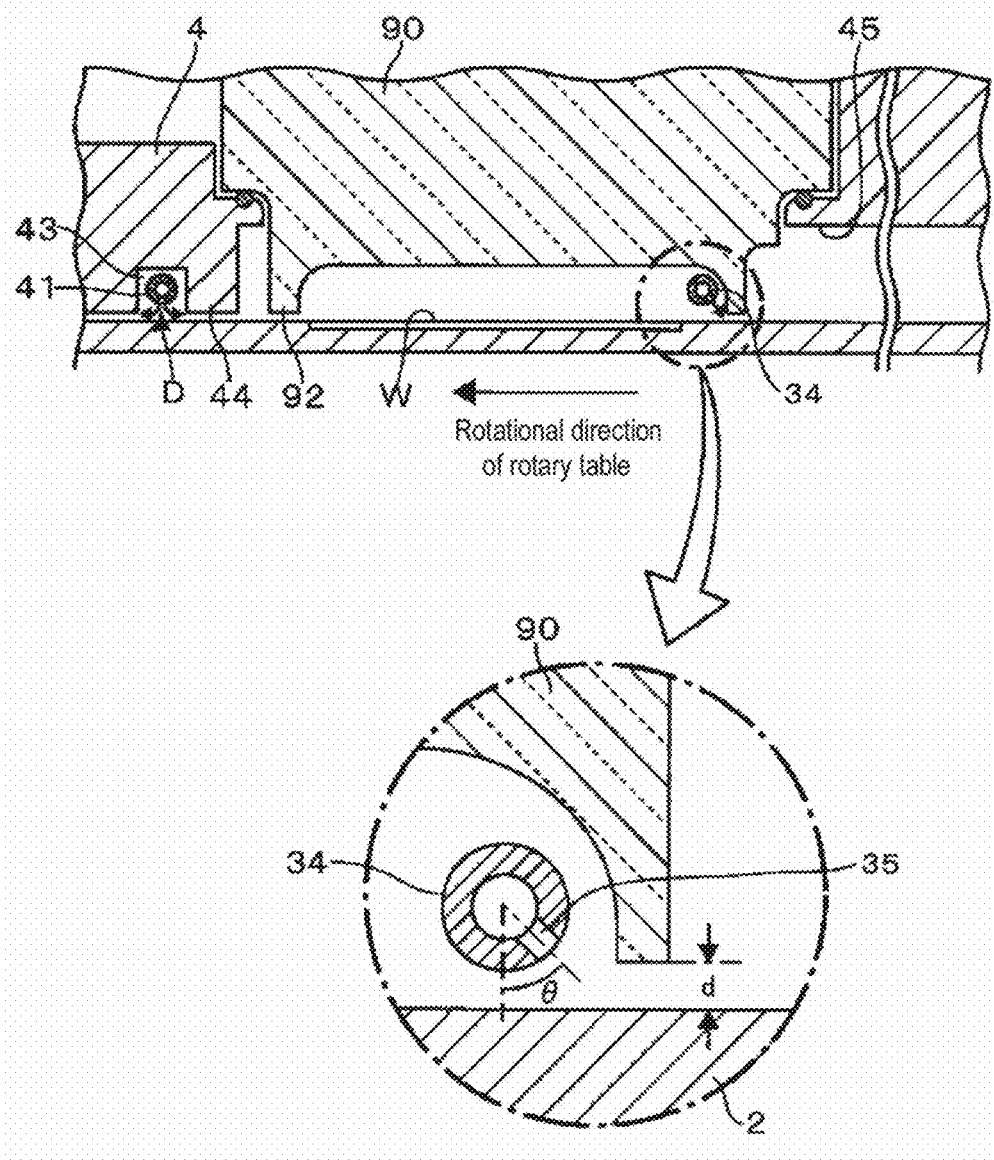
FIG. 7 is a longitudinal-sectional view illustrating a portion of the interior of an example of the film forming apparatus according to an embodiment of the present disclosure.

As illustrated in FIGS. 5 to 7, in order to suppress intrusion of an $N_2$ gas, an $O_3$ gas, or the like to a lower region of the housing 90, a peripheral portion extends from a lower surface of the housing 90 perpendicularly toward a lower side (the rotary table 2 side) along the circumferential direction to form a protrusion portion 92 for regulating a gas. Further, in a region surrounded by an inner peripheral surface of the protrusion portion 92, the lower surface of the housing 90 and the upper surface of the rotary table 2, the plasma generation gas nozzle 34 described above is received at an upstream side in the rotational direction of the rotary table 2.

That is, since a gas supplied from the plasma generation gas nozzle 34 is converted into plasma in a lower region (a plasma space 10) of the housing 90, if the $N_2$ gas intrudes into the lower region, plasma of the $N_2$ gas and plasma of the $O_2$ gas ($O_3$ gas) react with each other to generate an $NO_x$ gas. When the $NO_x$ gas is generated, the members within the vacuum container 1 are corroded. Thus, in order to make it difficult for the $N_2$ gas to move into the lower region of the housing 90, the protrusion portion 92 described above is formed on the lower surface of the housing 90.

The protrusion portion 92 at a proximal end side (the sidewall side of the vacuum container 1) of the plasma generation gas nozzle 34 is cut to have a substantially circular arc shape conforming to the outward form of the plasma generation gas nozzle 34. A separation dimension d between a lower surface of the protrusion portion 92 and the upper surface of the rotary table 2 ranges from 0.5 to 4 mm, and is set to 2 mm in this example. A width and a height of the protrusion portion 92 is set to, e.g., 10 mm and 28 mm, respectively. Further, FIG. 7 illustrates a longitudinal-sectional view of the vacuum container 1 taken along the rotational direction of the rotary table 2.

In addition, during a film forming process, the rotary table 2 rotates in a clockwise direction, and thus, the $N_2$ gas may move into the lower side of the housing through a gap between the rotary table 2 and the protrusion portion 92 in response to the rotation of the rotary table 2. Thus, in order to restrain movement of the $N_2$ gas into the lower side of the housing 90 through the gap, the gas is discharged to the lower side of the housing 90 against the gap. Specifically, as illustrated in FIGS. 5 and 7, the gas discharge hole 35 of the plasma generation gas nozzle 34 is disposed to aim at the gap, namely, face the position at the upstream side in the rotational direction of the rotary table 2 and concurrently at the lower side. An angle θ at which the gas discharge hole 35 of the plasma generation gas nozzle 34 is oriented with respect to the vertical axis is, e.g., about 45° as illustrated in FIG. 7.

Here, referring to the O-ring 11*d* that seals a region defined by the ceiling plate 11 and the housing 90 from the lower side (the plasma space 10) of the housing 90 described above, as illustrated in FIG. 5, the protrusion portion 92 is formed between the plasma space 10 and the O-ring 11*d* along the circumferential direction. Thus, it may be said that the O-ring 11*d* is separated from the plasma space 10 in order not to be directly exposed to plasma. Accordingly, although plasma in the plasma space 10 may be spread to, e.g., the O-ring 11*d* side, plasma becomes deactivated before reaching the O-ring 11*d* because it has to advance via the lower side of the protrusion portion 92.

Figure 8:
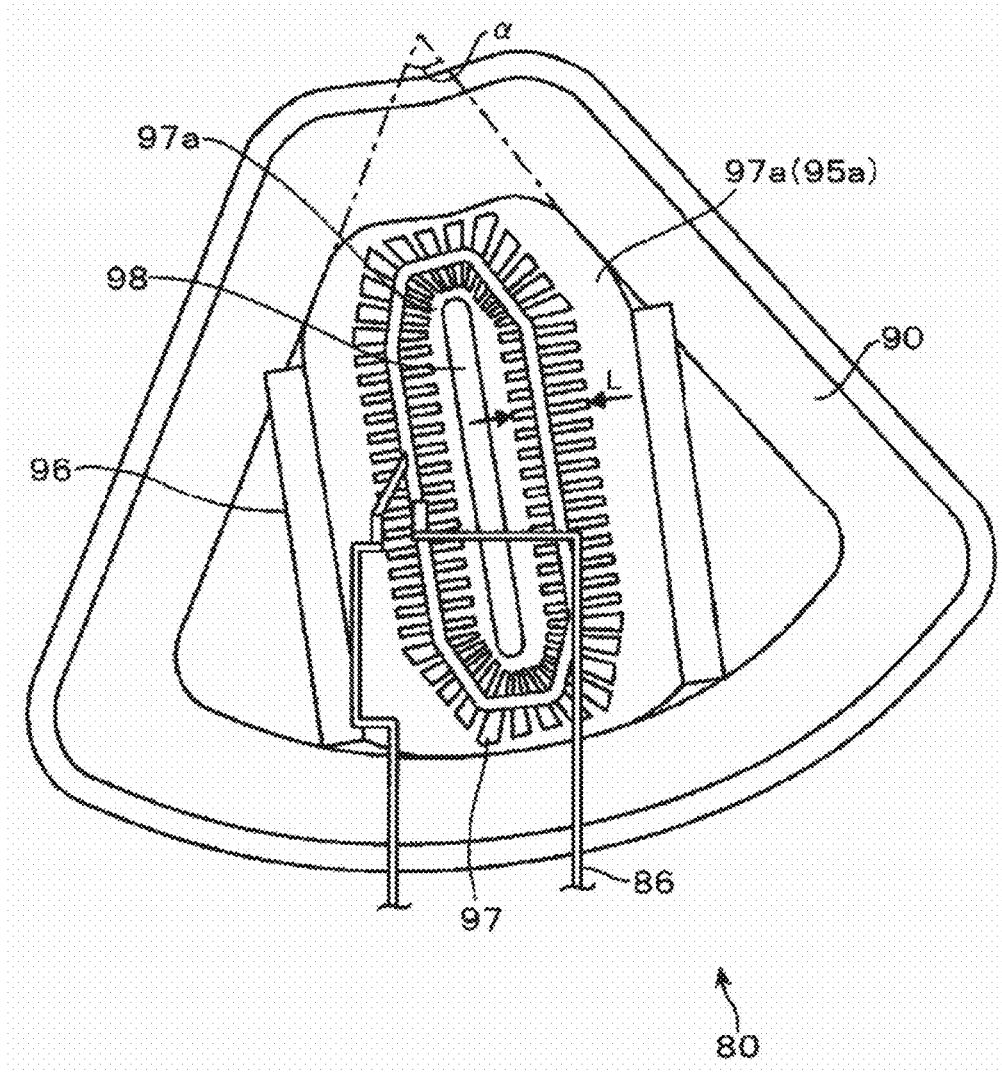
FIG. 8 is a plan view illustrating a portion of the interior of an example of the film forming apparatus according to an embodiment of the present disclosure.

As illustrated in FIGS. 4 and 8, a Faraday shield 95 having a substantially box shape with an upper side opened is received within the housing 90, and the Faraday shield 95 is formed of a metal plate as a conductive plate member 95*x* (FIG. 9) having a thickness dimension k ranging from 0.5 to 2 mm, and, e.g., about 1 mm in this example, and the Faraday shield 95 is grounded. In this example, the Faraday shield 95 is formed of a copper (Cu) plate or a plate member formed by plating a nickel (Ni) film and a gold (Au) film on a copper (Cu) plate from below. The Faraday shield 95 includes a horizontal surface 95*a* horizontally formed along a bottom surface of the housing 90 and a vertical surface 95*b* extending upwardly from a peripheral end of the horizontal surface 95*a* in a circumferential direction, and is configured to have a substantially hexagonal shape when viewed from above. In a substantially central portion of the horizontal surface 95*a*, a substantially octagonal opening 98 is formed in the shape of a window to allow observation of the state of plasma generation (a light emission state) in the vacuum container 1 from a position above the vacuum container 1, through an insulating plate 94 and the housing 90. For example, the Faraday shield 95 is formed by performing a rolling process on the metal plate or by bending a region outside of the horizontal surface 95*a* of the metal plate upwardly. Further, FIG. 4 illustrates a simplified Faraday shield 95 and FIG. 8 illustrates the Faraday shield 95 by cutting away a portion of the vertical surface 95*b*.

Further, a right upper edge and a left upper edge of the Faraday shield 95 when the Faraday shield 95 is viewed from the rotation center of the rotary table 2, extend horizontally to the right and left, respectively, forming support portions 96. In addition, a frame-shaped member 99 is installed between the Faraday shield 95 and the housing 90. The frame-shaped member 99 supports the support portions 96 from below and is supported by the flange portion 90*a* at the central region C side of the housing 90 and at the peripheral portion side of the rotary table 2. Thus, when the Faraday shield 95 is received within the housing 90, a lower surface of the Faraday shield 95 and an upper surface of the housing 90 are made in contact, and the support portions 96 are supported by the flange portion 90*a* of the housing 90 via the frame-shaped member 99.

On the horizontal surface 95*a* of the Faraday shield 95, an insulating plate 94 formed of, e.g., quartz and having a thickness dimension of, e.g., about 2 mm, is stacked in order to insulate the Faraday shield 95 from the plasma generating unit 80 loaded on the Faraday shield 95. Further, on the horizontal surface 95*a*, a plurality of slits 97 is formed, and conductive paths 97*a* are disposed on one end side and the other end side of each of the slits 97. The configurations and layout of the slits 97 and the conductive paths 97*a* will be described in detail together with the configuration of an antenna 83 of the plasma generating unit 80. Further, the illustration of the insulating plate 94 and the frame-shaped member 99 is omitted in FIGS. 8, 10 and the like, which are described later.

The plasma generating unit 80 is configured to be received within the Faraday shield 95. Thus, as illustrated in FIGS. 4 and 5, the plasma generating unit 80 is disposed to reach the interior (the wafer W on the rotary table 2) of the vacuum container 1 with the housing 90, the Faraday shield 95 and the insulating plate 94 interposed therebetween. In the plasma generating unit 80, the antenna 83 is configured to be wound around a vertical axis three times (around an axis vertically extending from the rotary table 2 to the plasma space 10) such that the antenna 83 surrounds a band shaped region extending in a radial direction of the rotary table 2, so that the antenna 83 constitutes a substantially octagonal shape elongated in a radial direction of the rotary table 2 when viewed from the plane. Thus, the antenna 83 is disposed along the surface of the wafer W on the rotary table 2.

An end portion of the antenna 83 at the central region C side and an end portion thereof at the peripheral portion side are disposed to be close to inner wall surfaces of the housing 90, respectively, in order to irradiate (supply) plasma over a region between the end portion of the wafer W at the central region C side and the end portion of the wafer W at the peripheral portion of the rotary table 2 side, when the wafer W is positioned below the plasma generating unit 80. Further, both end portions of the plasma generating unit 80 in the rotational direction of the rotary table 2 are disposed to be close to each other such that a width dimension of the housing 90 in the rotational direction of the rotary table 2 is reduced to be as small as possible. That is, as described above, in order to make a magnetic field generated by the plasma generating unit 80 reach the interior of the vacuum container 1, the housing 90 is formed of high purity quartz and formed to have a dimension greater than that of the antenna 83 when viewed from the plane (such that the quartz member is positioned at a lower side of the antenna 83). Thus, as the dimension of the antenna 83 when viewed from the plane increases, it is necessary to increase the dimension of the housing 90 below the antenna 83, whereby the cost of the device (the housing 90) is increased. On the other hand, when the dimension of the antenna 83 in the radial direction of the rotary table 2 is intended to be short, e.g., when the antenna 83 is disposed in a position biased to the central region C side or the peripheral portion side of the rotary table 2, there is a possibility that an amount of plasma supplied for the wafer W may become uneven in the in-plane of the wafer W. Thus, in the present disclosure, a portion of the antenna 83 at the upstream side and a portion of the antenna 83 at the downstream side in the rotational direction of the rotary table 2 are positioned near each other in order to evenly supply plasma into the in-plane of the wafer W and to reduce the dimension of the housing 90 when viewed from the plane to be as small as possible. Specifically, with respect to the elongated octagonal shape of the antenna 83 when viewed from the plane, a dimension in a lengthwise direction ranges, e.g., from 290 to 330 mm, and a dimension in a direction perpendicular to the lengthwise direction ranges, e.g., from 80 to 120 mm. Further, although a flow path through which a coolant flows is formed within the antenna 83, illustration thereof is omitted here.

The antenna 83 is connected to a high-frequency power source 85 having a frequency of, e.g., 13.56 MHz and output power of, e.g., 5000 W, through a matcher 84. In FIGS. 1, 3, and 4, reference numeral 86 denotes a connection electrode for electrically connecting the plasma generating unit 80, the matcher 84, and the high-frequency power source 85.

Figure 9:
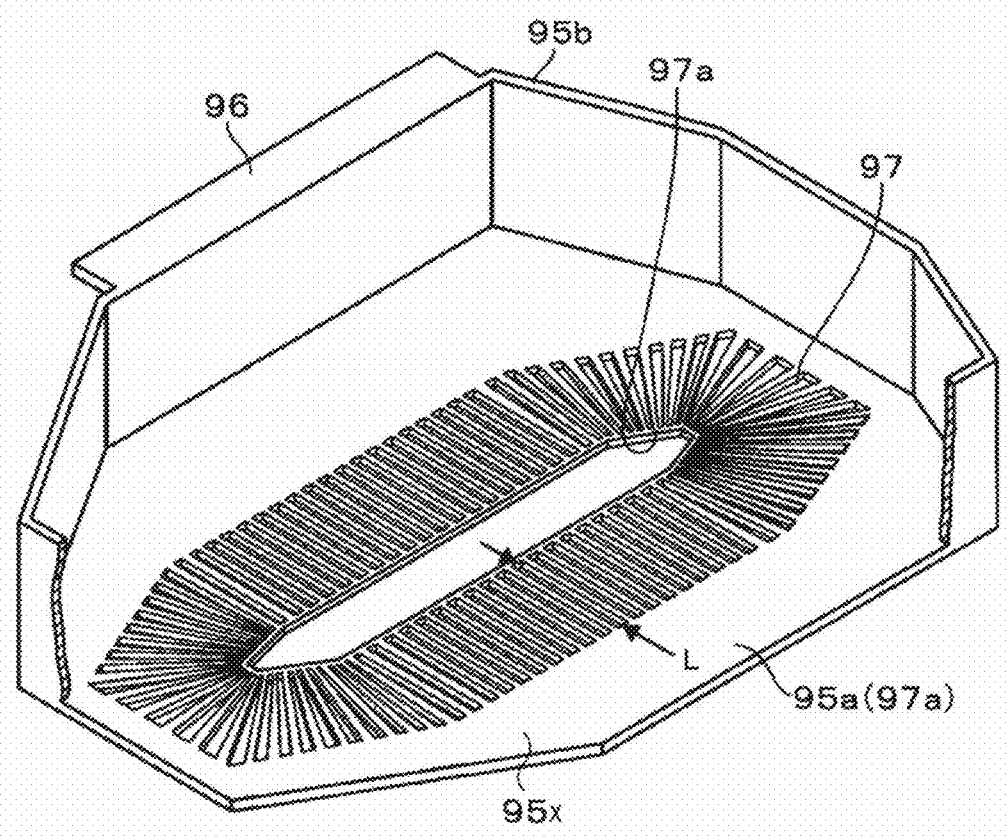
FIG. 9 is a perspective view illustrating a Faraday shield of an example of the film forming apparatus according to an embodiment of the present disclosure.

Here, the slits 97 of the Faraday shield 95 will be described in detail with reference to FIGS. 8 and 9. The slits 97 restrain an electric field component among an electric field and a magnetic field (electromagnetic field) generated by the plasma generating unit 80 from being oriented toward the wafer W therebelow, and make the magnetic field reach the wafer W. That is, when the electric field reaches the wafer W, an electrical wiring formed within the wafer W may be electrically damaged. On the other hand, since the Faraday shield 95 is formed of a grounded metal plate as described above, a magnetic field is also blocked together with an electric field unless the slits 97 are formed. Further, when a large opening is formed through a bottom side of the antenna 83, even an electric field, as well as a magnetic field, passes therethrough. Thus, in order to block an electric field and allow a magnetic field to pass therethrough, the slits 97 having a dimension and a layout set as described below are formed.

Specifically, as illustrated in FIG. 8, the slits 97 are each formed in a position below the antenna 83 in a circumferential direction such that the slits 97 extend in a direction perpendicular to the winding direction of the antenna 83. Thus, for example, in a region along a lengthwise direction of the antenna 83 (a radial direction of the rotary table 2), the slits 97 are formed to have a linear shape running in a tangential direction of the rotary table 2. Further, in a region perpendicular to the lengthwise direction, the slits 97 are formed along the lengthwise direction. In addition, in a portion where the antenna 83 is bent between the two regions, the slits 97 are formed in an inclined direction with respect to each of the circumferential direction and the radial direction of the rotary table 2 such that the slits 97 are perpendicular to a direction in which the antenna 83 extends in the bent portion. Furthermore, in the central region C side and the peripheral portion side of the rotary table 2, the slits 97 are formed to have a width dimension reduced from an outer circumferential portion of the antenna 83 toward an inner circumferential portion thereof in order to secure a disposition region of the slits 97, i.e., to allow the slits 97 to be disposed, as much as possible, without a gap between the slits. Thus, the plurality of slits 97 are arranged in a lengthwise direction of the antenna 83.

Here, as described above, the high-frequency power source 85 having a frequency of 13.56 MHz is connected to the antenna 83, and a wavelength corresponding to the frequency is 22 m. Thus, the slits 97 are formed to have a width dimension d1 ranging from 1 to 6 mm, and 2 mm in this example, and a separation dimension d2 between the slits 97 ranging from 2 to 8 mm, and 2 mm in this example, as illustrated in FIG. 10, such that the width direction of the slits 97 becomes a dimension of about 1/10000 or less of the wavelength. Further, as described above with reference to FIG. 8, the slits 97 are formed over a range from a position spaced apart from the right end of the antenna 83 by about 30 mm rightward to a position spaced apart from the left end of the antenna 83 by about 30 mm leftward such that a length dimension L ranges from 40 to 120 mm, and is 60 mm in this example, when viewed in a plane. Thus, it can be said that the conductive paths 97a that form a portion of the Faraday shield 95 are formed along the winding direction (lengthwise direction) of the antenna 83 on one end and on the other end of each slit 97 in the lengthwise direction, respectively. In other words, in the Faraday shield 95, the conductive paths 97a are installed such that one end and the other end of each slit 97 in the lengthwise direction are not opened, that is, such that both ends of each slit 97 are closed. A width dimension of each of the conductive paths 97a ranges from about 1 to 4 mm, for example, and is 2 mm in this example. The reason for forming these conductive paths 97a will be described in detail by firstly taking the conductive path 97a formed in an inner region of the antenna 83 as an example.

The slits 97 block the electric field component and allow the magnetic field component to pass therethrough, among electromagnetic fields formed by the antenna 83. Thus, in order to secure the magnetic field component as much as possible, while blocking the electric field component that reaches the wafer W side, the slits 97 are formed in some embodiments to be as long as possible. However, as described above, in order to reduce the dimension of the housing 90 in the rotational direction of the rotary table 2 as small as possible, the antenna 83 has a substantially elongated octagonal shape and the portion of the upstream side of antenna 83 in the rotational direction of the rotary table 2 and the portion of the downstream side of antenna 83 in the rotational direction of the rotary table 2 are positioned near each other. In addition, in the horizontal surface 95a of the Faraday shield 95, an opening 98 for checking out a light emission state of plasma is formed in region surrounded by the antenna 83. Thus, in the inner region of the antenna 83, it is difficult to have a length dimension L of the slits 97 for sufficiently blocking the electric field component formed by the antenna 83. On the other hand, if the conductive path 97a is not formed in the inner region of the antenna 83 in order to secure the length dimension L of the slits 97, the electric field component is leaked to the wafer W through the opening of the slits 97. Thus, in the present disclosure, in order to block the electric field component to be leaked to the wafer W through the inner region, the conductive path 97a is installed to block the opening of each slit 97. Accordingly, the electric field component downwardly moving from the inner region can not move into a side of wafer W, since an electric force line is closed by the conductive path 97a. Further, regarding the outer circumference side of the antenna 83, the conductive path 97a is also formed to block an electric field component that may be leaked from the end portion of each slit 97 at the outer circumference side. In this manner, each slit 97 is surrounded by the grounded conductor in the circumferential direction when viewed from above.

In this example, in the region surrounded by the conductive path 97a in the inner region of the antenna 83 (the region surrounded by the group of slits 97), the opening 98 described above is formed. Further, through the opening 98, a light emission state of plasma within the vacuum container 1 is checked by, e.g., the naked eyes of an operator or by a camera (not shown). Further, in FIG. 3, the slits 97 are omitted. In addition, although FIGS. 4 and 5 shows simplified slits 97, for example, about 150 slits 97 are formed. A plasma generating device is formed by the antenna 83 and the Faraday shield 95 having the slits 97 and the conductive path 97a formed therein.

Figure 11:
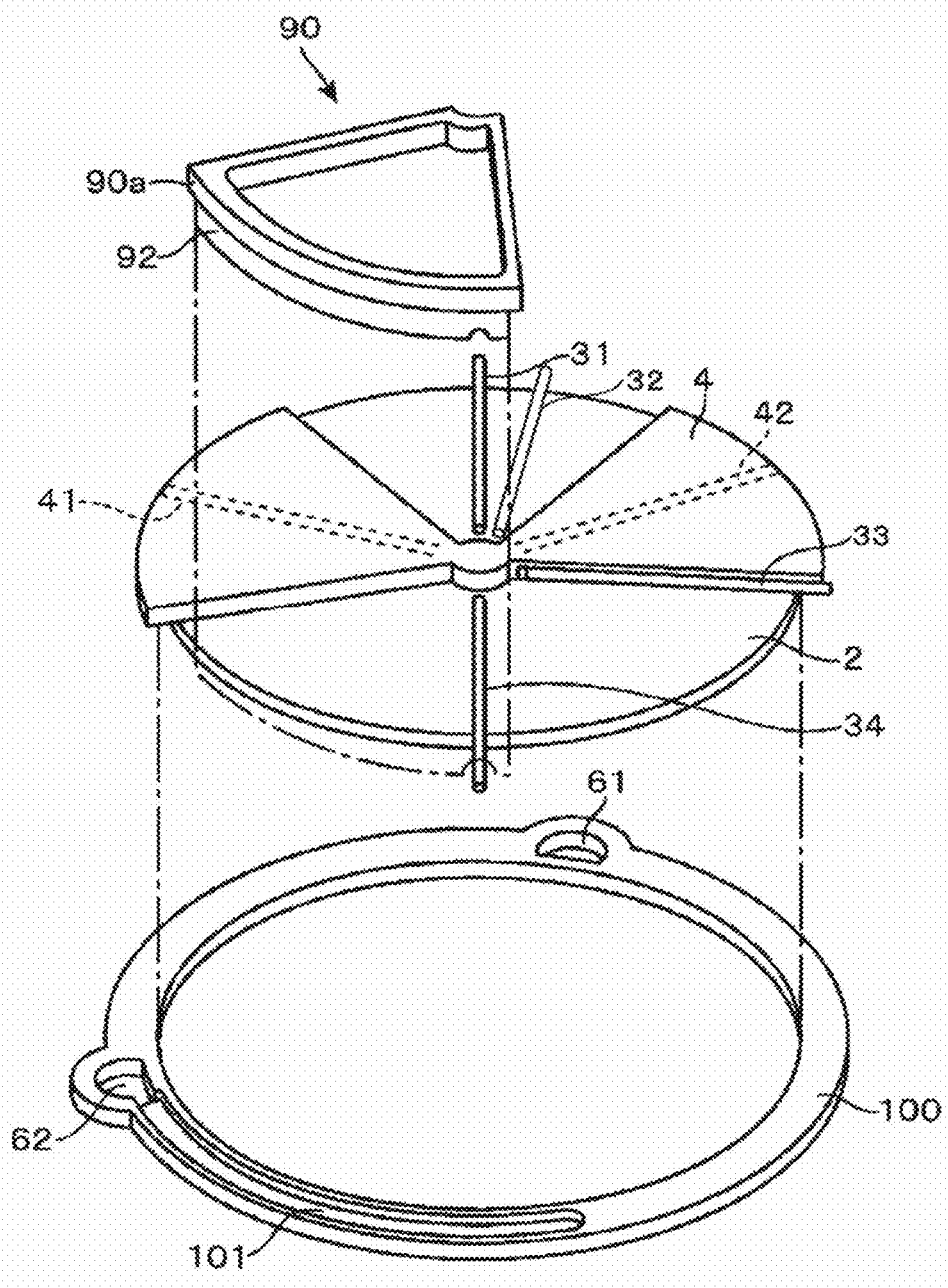
FIG. 11 is a perspective view illustrating a side ring of an example of the film forming apparatus according to an embodiment of the present disclosure.

Next, each component of the vacuum container 1 will be described. In a position slightly lower than the rotary table 2 at the periphery side of the rotary table 2, as illustrated in FIGS. 2, 5, and 11, a side ring 100 as a cover member is disposed. The side ring 100 serves to protect an inner wall of the vacuum container 1 from a fluorine-based cleaning gas when the fluorine-based cleaning gas flows instead of each process gas, for example, in cleaning a device. That is, if the side ring 100 is not installed, an air flow passage having a concave portion shape in which an air flow (exhaust flow) is formed in a horizontal direction may be formed to have a ring shape in a circumferential direction between the peripheral portion of the rotary table 2 and the inner wall of the vacuum container 1. Thus, the side ring 100 is installed in the air flow passage such that the inner wall surface of the vacuum container 1 is not exposed, as much as possible, to the air flow passage. In this example, each separation region D and the region of the peripheral portion of the housing 90 are exposed to an upper side of the side ring 100.

On an upper surface of the side ring 100, exhaust ports 61 and 62 are formed in two positions spaced apart from each other in a circumferential direction. In other words, two exhaust ports are formed in a lower side of the aforementioned air flow passage, and the exhaust ports 61 and 62 are formed on the side ring 100 in the positions corresponding to the exhaust ports, respectively. When the two exhaust ports 61 and 62 are called a first exhaust port 61 and a second exhaust port 62, respectively, the first exhaust port 61 is formed in a position biased to the separation region D between the first and second process gas nozzles 31 and 32 and the separation region D positioned at the lower stream side in the rotational direction of the rotary table than the first process gas nozzle 31 and the second process gas nozzle 32. The second exhaust port 62 is formed in a position biased to the separation region D between the plasma generation gas nozzle 34 and the separation region D positioned at the lower stream side in the rotational direction of the rotary table than the plasma generation gas nozzle 34. The first exhaust port 61 serves to exhaust a first process gas and a separation gas, and the second exhaust port 62 serves to exhaust a plasma generation gas in addition to a second process gas and a separation gas. As illustrated in FIG. 1, the first exhaust port 61 and the second exhaust port 62 are each connected to, e.g., a vacuum pump 64 as a vacuum exhaust mechanism, by an exhaust pipe 63 having a pressure regulating unit 65 such as a buffer fly valve.

Here, as described above, since the housing 90 is formed from the central region C side to the peripheral portion side, the gases discharged to the upstream side of the housing 90 in the rotational direction of the rotary table 2, namely, the gases that are going toward the second exhaust port 62 are regulated by the housing 90. Thus, a gas channel 101 having a recess shape for allowing the second process gas and the separation gas to flow therein is formed on an upper surface of the side ring 100 at the outer side of the housing 90 as described above. Specifically, as illustrated in FIG. 3, the gas channel 101 is formed to have a circular arc shape extending from a position biased toward the third process gas nozzle 33 side by, e.g., about 60 mm, from an end portion of the housing 90 at the upstream side in the rotational direction of the rotary table 2, to the second exhaust port 62 described above such that a depth dimension is, e.g., 30 mm Thus, the gas channel 101 is formed along the peripheral portion of the housing 90 to extend below the peripheral portion of the housing 90 when viewed in a plane. Although not shown, a surface of the side ring 100 is coated with, e.g., alumina, or covered by a quartz cover or the like, in order to have corrosion resistance to the fluorine based gas.

In the central portion of the lower surface of the ceiling plate 11, as illustrated in FIG. 2, a protrusion portion 5 is formed to have a substantially ring shape in a circumferential direction. The protrusion portion 5 extends from a portion of the central region C side in the convex portion 4, and a lower surface of the protrusion portion 5 has the same height as that of the lower surface (the ceiling surface 44) of the convex portion 4. On an upper side of a core part 21 positioned closer to the rotation center side of the rotary table 2 than the protrusion portion 5, a labyrinth structure portion 110 is disposed to suppress mixing of the first process gas and the second process gas in the central region C. That is, as can be seen from FIG. 1, since the housing 90 is formed up to a position biased to the central region C, the core part 21 that supports the central portion of the rotary table 2 is formed at the position biased to the rotation center in order for portions above the rotary table 2 to avoid the interference with the housing 90. Thus, the process gases may be, e.g., easily mixed with each other in the central region C, compared with the peripheral portion. Thus, by forming the labyrinth structure portion 110, gas channels are prepared to prevent mixing of the process gases.

In a space between the rotary table 2 and a bottom portion 14 of the vacuum container 1, as illustrated in FIG. 1, a heater unit 7 as a heating mechanism is installed. The heater unit 7 heats the wafer W on the rotary table 2 via the rotary table 2 to, e.g., 300 degrees C. Further, as illustrated in FIG. 1, a cover member 71a is installed on the lateral side of the heater unit 7, and a covering member 7a covers the upper side of the heater unit 7. In addition, a purge gas supply pipe 73 for purging a space in which the heater unit 7 is arranged in the bottom portion 14 of the vacuum container 1 in a plurality of places along a circumferential direction in the lower side of the heater unit 7.

As illustrated in FIGS. 2 and 3, on the sidewall of the vacuum container 1, the transfer port 15 for transferring the wafer W between an external transfer arm (not shown) and the rotary table 2 is formed, and the transfer port 15 is configured to be airtightly opened and closed by a gate valve G. Further, the transfer of the wafer W is performed between the concave portion 24 of the rotary table 2 and the transfer arm when the concave portion 24 comes in a transfer position at which it faces the transfer port 15. A lifting pin (not shown) and a lifting mechanism (not shown) for lifting the wafer W from a rear surface of the wafer W through the concave portion 24 are installed in corresponding portions to the transfer position at the lower side of the rotary table 2.

In addition, a control unit 120 configured as a computer for controlling overall operations of the apparatus is installed in this film forming apparatus, and a program for executing a film forming process and a modifying process described later is stored in a memory of the control unit 120. The program includes a group of steps to execute an operation of the apparatus described later, and is installed in the control unit 120 from a storage unit 121 as a storage medium such as a hard disk, a compact disk, an optical magnetic disk, a memory card, or a flexible disk.

(Film Forming Method)

Next, a film forming method according to an embodiment of the present disclosure using the film forming apparatus described above will be described. Further, the film forming method according to the present embodiment is not limited to the implementation by the film forming apparatus described above, and may be applicable to any other ALD apparatuses, or any other film forming apparatuses in which a film is formed using a gas and low temperature plasma, and in order to facilitate understanding, the film forming method using the film forming apparatus described above will be described.

First, the film forming method according to the present embodiment provides a method of forming a film which has good processability and a surface that is not crystallized and thus not roughened and which can be used for a hard mask for forming a pattern, or the like. Thus, this is not a film forming method for forming a film specified in type used in a general electronic circuit, and it is more important to manufacture a film having good processability. Further, the processability herein means the level of ease in processing, e.g., etching processability means the level of ease in etching process.

In general, a $TiO_2$ film has good etching processability and thus is appropriate for a hard mask. A crystallization temperature of the $TiO_2$ film is about 160 degrees C. Under a temperature setting to low temperature plasma ranging from about 60 to about 80 degrees C., reaching a crystallization temperature is theoretically difficult, but, in reality, is sometimes available due to the energy of plasma during a film forming process, whereby a surface of the $TiO_2$ film is crystallized and roughened. Thus, conditions for forming a good film are limited to a narrow range and a set rotation speed of the rotary table or the like is limited. In order to be used for a hard mask, a surface of the film is, in some embodiments, in an amorphous state, and the amorphous-state film has a smooth surface and thus excellent processability. Thus, in some embodiments, the $TiO_2$ film is formed in an amorphous state. However, sometimes modifying a film using plasma is indispensable. Further, when plasma is used, a substantial crystallization temperature of the $TiO_2$ film may be lowered, leading to a possibility of resulting in a roughened film.

On the other hand, an $Al_2O_3$ film has a crystallization temperature ranging from about 300 to 400 degrees C., which is very high, as being two to three times higher that of the crystallization temperature of the $TiO_2$ film. Thus, in the film forming method according to an embodiment of the present disclosure, the $Al_2O_3$ film having a high crystallization temperature is mixed to generate a mixture film of TiAlO, thereby preventing crystallization of a surface, and forming a film in an amorphous state to form a film having a smooth surface. Here, although the $Al_2O_3$ film does not have good etching processability, an alloy film of an amorphous state with good etching processability can be formed by setting a mixing ratio of $Al_2O_3$ film to be smaller than that of the $TiO_2$ film.

In this manner, in the film forming method according to an embodiment of the present disclosure, the $Al_2O_3$ film having low processability but having high crystallization temperature is mixed with the $TiO_2$ film which has good processability but is crystallized in a modifying process using plasma due to low crystallization temperature, so that the crystallization temperature is increased to generate an alloy film capable of maintaining good processability, while preventing crystallization of a surface of the film.

Hereinafter, the method of forming an alloy film using the film forming apparatus described above will be described.

First, the gate valve G is opened and, e.g., five wafers W, are loaded on the rotary table 2 through the transfer port 15 by a transfer arm (not shown), while intermittently rotating the rotary table 2. Subsequently, the gate valve G is closed, the interior of the vacuum container 1 is vacuumized by a vacuum pump 64, and the wafers W are heated by the heater unit 7 to a temperature ranging from, e.g., about 60 to 80 degrees C., while rotating the rotary table 2 in a clockwise direction. Due to using plasma, the temperature of the wafers W may be set to a temperature lower than a process that does not use plasma. Thus, the temperature may be set to a temperature lower than about 160 degrees C., which is a crystallization temperature of the $TiO_2$ film, but the same effect as in the case where the surface of the $TiO_2$ film is heated to a temperature equal to or higher than 160 degrees C. can be obtained due to plasma energy.

A rotation speed of the rotary table 2 may vary depending on processes, but, for example, in case of forming a TiAlO film, the rotation speed may range from 30 to 240 rpm. If the rotation speed is too low, a plasma irradiation time is lengthened and a possibility of film damage may increase, while if the rotation speed is too high, a source gas may not be sufficiently attached to the wafers W, degrading coverage characteristics. Thus, it is important that the rotation speed of the rotary table 2 is set to an appropriate rotation speed at which the plasma irradiation time is not excessively lengthened and coverage characteristics are not degraded.

Subsequently, a $TiCl_4$ gas and a TMA gas are discharged from the process gas nozzles 31 and 32, respectively, and a mixture of an Ar gas and an $O_2$ gas is discharged from the plasma generation gas nozzle 34. Further, an $N_2$ gas is discharged from the process gas nozzle 33. Similarly, a separation gas is discharged from the separation gas nozzles 41 and 42 in a predetermined flow rate, and a $N_2$ gas is also discharged from the separation gas supply pipe 51 and the purge gas supply pipes 72 and 73 in predetermined flow rates. Next, the interior of the vacuum container 1 is adjusted to a preset process pressure by the pressure regulating unit 65. Further, a high frequency power is supplied to the plasma generating unit 80.

In the first process region P1, since the $TiCl_4$ gas and the TMA gas are simultaneously supplied from the process gas nozzles 31 and 32, these gases are attached to the surface of the wafer W. Further, a source gas (process gas) containing Ti as a first metal element, and a source gas (process gas) containing Al as a second metal element are selected as source gases. The source gases have a relationship in which $Al_2O_3$, which is an oxide of Al, has a higher crystallization temperature than that of $TiO_2$, which is an oxide of Ti. Further, since a $TiO_2$ film has better etching processability than that of an $Al_2O_3$ film, the $TiO_2$ film is supplied in a mixing ratio higher than that of the $Al_2O_3$ film. Thus, in general, a flow rate of the $TiCl_4$ gas supplied from the process gas nozzle 31 is greater than that of the TMA gas supplied from the process gas nozzle 32. In this case, as long as a mixing ratio of Ti is set to be greater than that of Al in a TiAlO film as a final product, there is no problem even in a case where the flow rate of the TMA gas is greater than that of the $TiCl_4$ gas.

At this time, there is a possibility that the flow of the $N_2$ gas that flows toward the housing 90 in response to, e.g., the rotation of the rotary table 2, from the upstream side in the rotational direction of the rotary table 2 than the housing 90 is disturbed by the housing 90. However, since the gas channel 101 is formed in the side ring 100 positioned at the peripheral portion side of the housing 90, the $N_2$ gas is exhausted through the gas channel 101 to avoid the housing 90.

On the other hand, there is a possibility that a portion of gases that flow toward the housing 90 from the upstream side of the housing 90 move into the lower side of the housing 90. However, in the region below the housing 90, the protrusion portion 92 is formed to cover the region while the gas discharge hole 35 of the plasma generation gas nozzle 34 is directed obliquely downward toward the upstream side in the rotational direction of the rotary table 2. Thus, a plasma generation gas discharged from the plasma generation gas nozzle 34 collides with a lower side of the protrusion portion 92 to drive the $N_2$ gas flowing from the upstream side to the outside of the housing 90. Further, the plasma generation gas is pushed toward the downstream side in the rotational direction of the rotary table by the protrusion portion 92. At this time, by forming the protrusion portion 92, the plasma space 10 below the housing 90 has a positive pressure of, e.g., about 10 Pa more than other regions within the vacuum container 1. This further restrains movement of the $N_2$ gas into the lower side of the housing 90.

Figure 12:
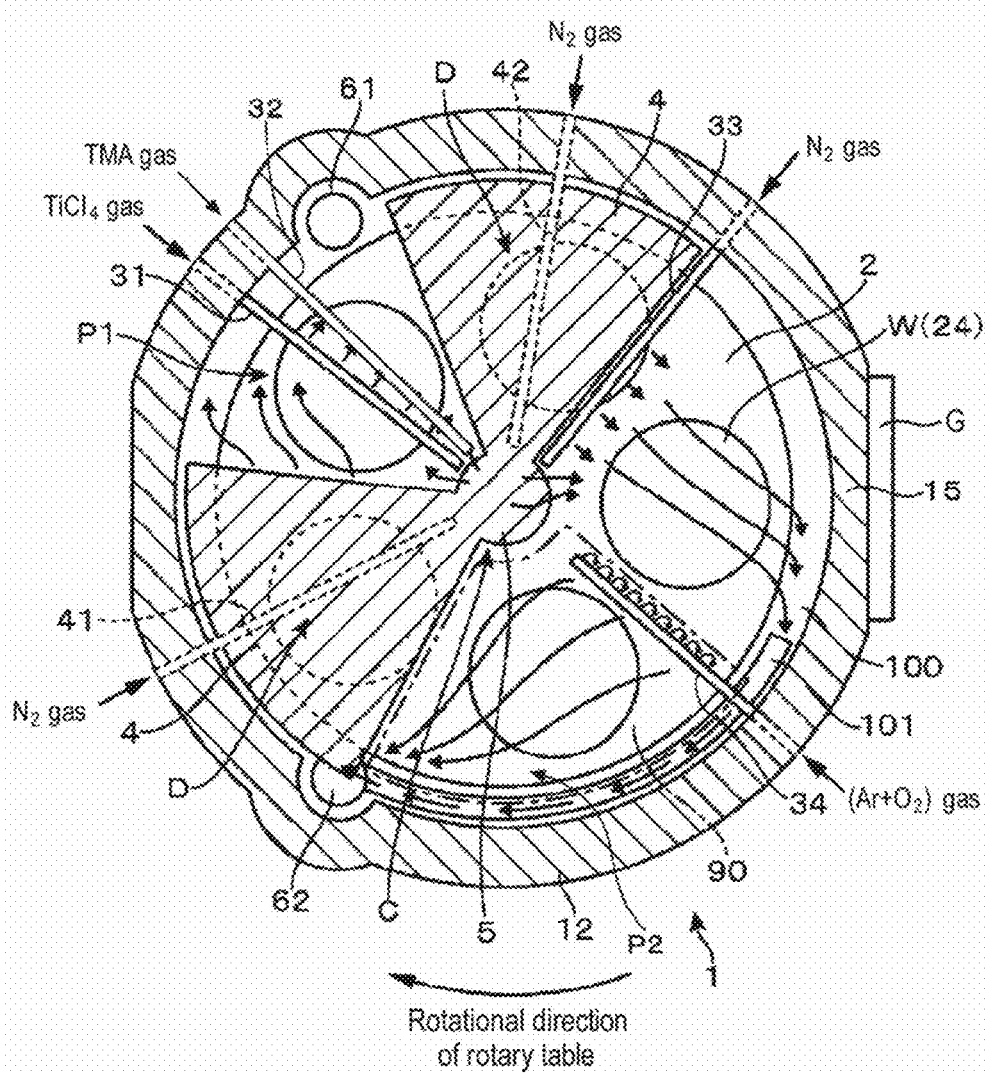
FIG. 12 is a schematic view illustrating a flow of a gas in an example of a film forming method according to an embodiment of the present disclosure.

Further, since the $N_2$ gas is supplied between the first process region P1 and the second process region P2, as illustrated in FIG. 12, each gas is exhausted such that the Ti-containing gas, the Al-containing gas, and the plasma generation gas are not mixed. Further, since the purge gas is supplied to the lower side of the rotary table 2, the gas diffusing to the lower side of the rotary table 2 is pushed back toward the exhaust ports 61 and 62 by the purge gas.

Figure 13:
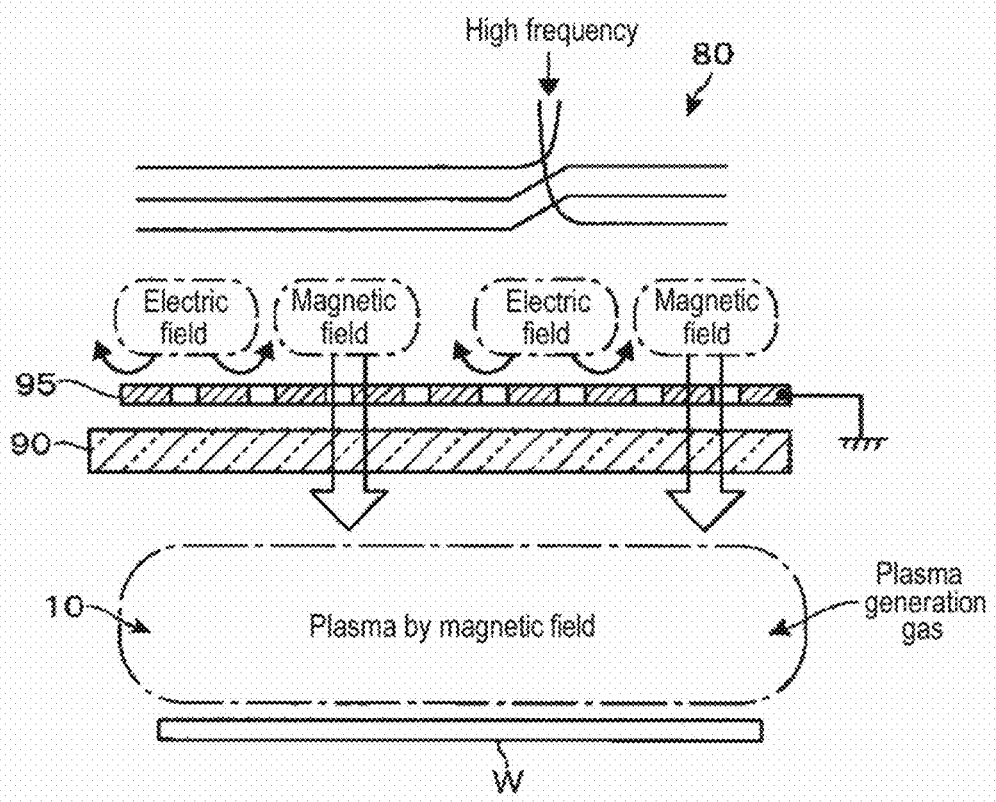
FIG. 13 is a schematic view illustrating generation of plasma in an example of the film forming method according to an embodiment of the present disclosure.

At this time, the plasma generating unit 80 generates an electric field and a magnetic field by a high frequency power supplied from the high-frequency power source 85 as schematically illustrated in FIG. 13. Since the Faraday shield 95 is installed as described above, the electric field among the electric field and the magnetic field, is reflected or absorbed (attenuated) by the Faraday shield 95 and thus is prevented (shut off) from reaching the interior of the vacuum container 1. Further, since the conductive paths 97a are installed on one ends and the other ends in the lengthwise direction of the slits 97, an electric field going to the wafer W from one ends and the other ends of the slits 97 is absorbed as, e.g., heat by the Faraday shield 95, and thus, is prevented from reaching the wafer W. On the other hand, due to the slits 97 formed in the Faraday shield 95, the magnetic field passes through the slits 97 and reaches the interior of the vacuum container 1 through a lower surface of the housing 90. Further, since the slits 97 are not formed in the circumferential direction of the Faraday shield 95 (vertical surface 95b) at the lateral side of the plasma generating unit 80, the electric field and the magnetic field do not go to the lower side via the lateral side.

Thus, the plasma generation gas discharged from the plasma generation gas nozzle 34 is activated by the magnetic field introduced after passing through the slits 97 to generate plasma such as, e.g., ions or radicals. As described above, since the antenna 83 is disposed to surround the band-shaped region that extends in the radial direction of the rotary table 2, the plasma has a substantially linear shape to extend in the radial direction of the rotary table 2 from the lower side of the antenna 83. Further, FIG. 13 schematically shows the plasma generating unit 80 and dimensions of the plasma generating unit 80, the Faraday shield 95, the housing 90, and the wafer W are schematically enlargedly illustrated.

On the other hand, through the rotation of the rotary table 2, the TiCl$_4$ and the TMA gas are adsorbed to the surface of the wafer W in the first process region P1, and subsequently, the TiCl$_4$ gas and the TMA gas adsorbed onto the wafer W are oxidized in the second process region P2 and a modifying process is performed, whereby one or a more molecular layers of TiAlO, as a thin film component, is formed as a reaction product. Specifically, by supplying the oxidizing gas converted into plasma to the surface of the wafer W, the Ti element and the Al element adsorbed to the surface of the wafer W are oxidized. At the same time, by colliding of plasma with the surface of the wafer W, for example, impurities are emitted from the TiAlO film or elements within the TiAlO film are rearranged to enhance densification (high density) of the TiAlO film. At that time, if only the TiO$_2$ film exists, the surface of the TiO$_2$ film reaches substantially the crystallization temperature by energy of plasma and is crystallized. However, since the Al$_2$O$_3$ film having a high crystallization temperature also exists together with the TiO$_2$ film, the overall TiAlO film is not crystallized and thus the film forming process proceeds while maintaining an amorphous state.

In this manner, while continuously rotating the rotary table 2, adsorption of the Ti-containing gas and the Al-containing gas to the surface of the wafer W, oxidation of the components of the Ti-containing gas and the Al-containing gas adsorbed to the surface of the wafer W, and plasma modification of the reaction product are performed a plurality of times in this order, without causing surface crystallization, whereby the reaction product in an amorphous state are stacked to form a thin film. Here, as described above, an electric wiring structure is formed within the wafers W, but since the electric field is shut off by installing the Faraday shield 95 between the plasma generating unit 80 and the wafers W, electrical damage to the electric wiring structure can be suppressed.

EMBODIMENT

Next, a film forming method according to an embodiment of the present disclosure will be described.

Figure 14:
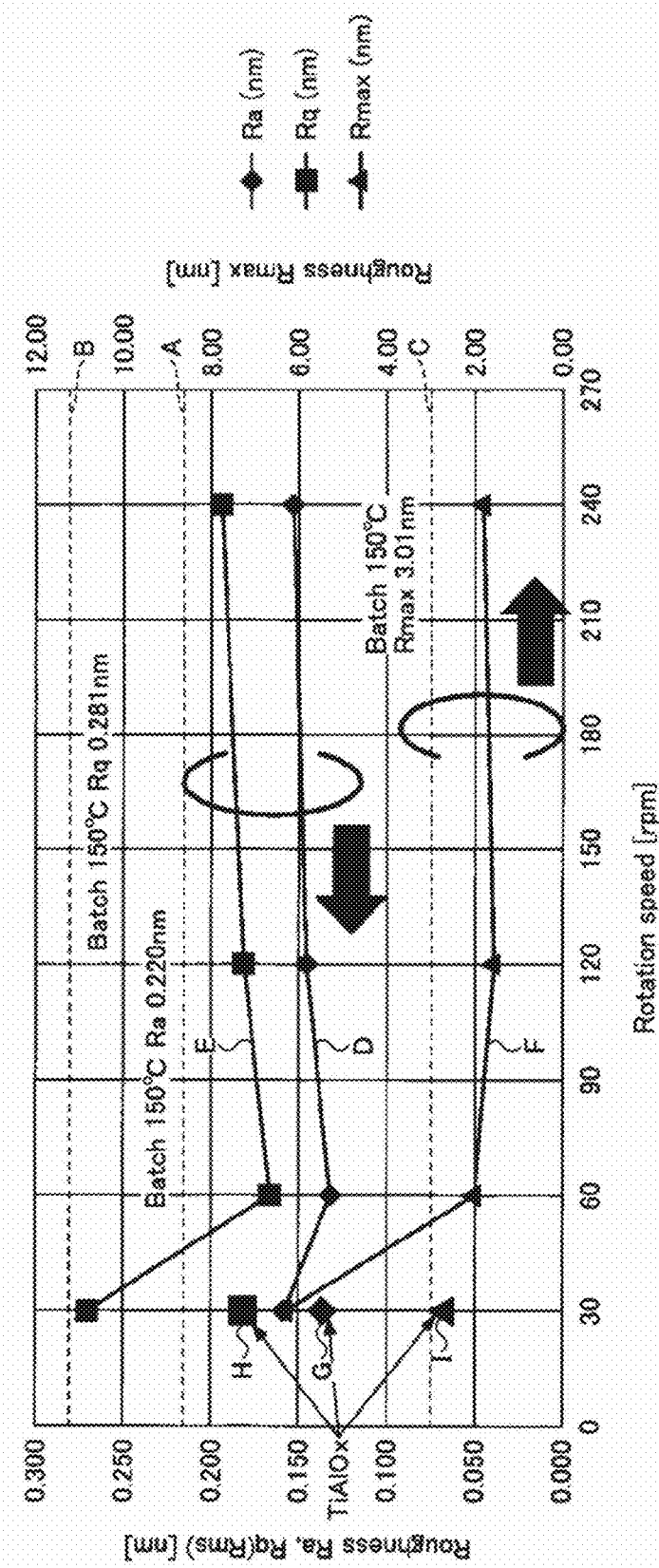
FIG. 14 is a view illustrating the result of performing the film forming method according to an embodiment of the present disclosure.

FIG. 14 is a view illustrating the results obtained by performing the film forming method according to an embodiment of the present disclosure. Further, a temperature of the wafer W was set to 80 degrees C. In FIG. 14, the broken lines A, B, and C denote arithmetic average roughness (Ra), a mean square roughness (Rq), and maximum roughness (Rmax) of the surface of the TiO$_2$ film, respectively, when the TiO$_2$ film is formed alone by using a batch type vertical heat treatment furnace. The vertical heat treatment furnace is a film forming apparatus in which about 100 wafers W are accommodated in the vertical heat treatment furnace and a film forming is performed by performing heat treatment while supplying a process gas. According to the results of forming the single TiO$_2$ film by performing heat treatment at a temperature of 150 degrees C. by using the vertical heat treatment furnace, the arithmetic average roughness (Ra) was 0.220 nm, the mean square roughness (Rq) was 0.281 nm, and the maximum roughness (Rmax) was 3.01 nm.

Further, the characteristic lines D, E, and F denote the results of forming the single TiO$_2$ film by using the film forming apparatus according to the present embodiment. In this case, the arithmetic average roughness (Ra), the mean square roughness (Rq), and the maximum roughness (Rmax) were lower than the broken lines A, B, and C when the rotation speed of the rotary table 2 was within a range from 60 to 240 rpm, so that a smooth film was formed. However, when the rotation speed was 30 rpm, lower surface roughness than that in the vertical heat treatment furnace was obtained with respect to the arithmetic average roughness (Ra) and the mean square roughness (Rq), but with respect to the maximum roughness (Rmax), the roughness was considerably high as twice high as that in the vertical heat treatment. The important roughness item is the maximum roughness (Rmax) since, even if only one rough portion is present among the roughness items, the film cannot be used as a mask. Thus, when the conventional film forming method is performed by using the film forming apparatus according to the present embodiment, good results cannot be obtained at a rotation speed of 30 rpm.

On the other hand, the points G, H, and I denote the results of performing the film forming method according to the present embodiment. When the TiAlO film was formed by setting the rotation speed of the rotary table to 2 to 30 rpm by using the film forming apparatus according to the present embodiment, better results with roughness lower than that in using the vertical heat treatment furnace and that in the conventional process using the film forming apparatus according to the embodiment of the present disclosure were obtained with respect to all the items of the arithmetic average roughness (Ra), the mean square roughness (Rq), and the maximum roughness (Rmax). Thus, by performing the film forming method according to the present embodiment, the good TiAlO film with a smooth surface can be formed under the condition of a widened range of the rotation speed.

In FIG. 14, even in forming the single TiO$_2$ film using the film forming apparatus according to the present embodiment, good results were obtained in the rotation speed range of 60 to 240 rpm, but under a condition in which a temperature of the wafers W is raised, a range of rotation speed at which the roughness is increased may exist. Even in that case, when the film forming method according to the present embodiment is performed, a good film with low surface roughness can be formed under a widened range of condition.

FIGS. 15A and 15B illustrate the results when a rotation speed of the rotary table 2 was set to 30 rpm in FIG. 14. FIG. 15A shows the results of performing the conventional film forming method, and FIG. 15B shows the results of performing the film forming method according to the present embodiment.

In FIG. 15A, roughness of the film surface was conspicuously high, and according to the data, the arithmetic average roughness (Ra) was 0.159 nm, the mean square roughness (Rq) was 0.271 nm, and the maximum roughness (Rmax) was 6.31 nm.

On the other hand, in FIG. 15B, the film surface was fine and according to the data, the arithmetic average roughness (Ra) was 0.143 nm, the mean square roughness (Rq) was 0.181 nm, and the maximum roughness (Rmax) was 2.62 nm and all roughness items were lower than that of the conventional film forming method. In particular, the maximum roughness (Rmax) was reduced to half, realizing significant improvement.

Further, a mixing ratio of Ti and Al in the TiAlO film was 1:0.85, and a mixing ratio of Ti was greater than that of Al. Thus, good film processability could be maintained.

Figure 16:
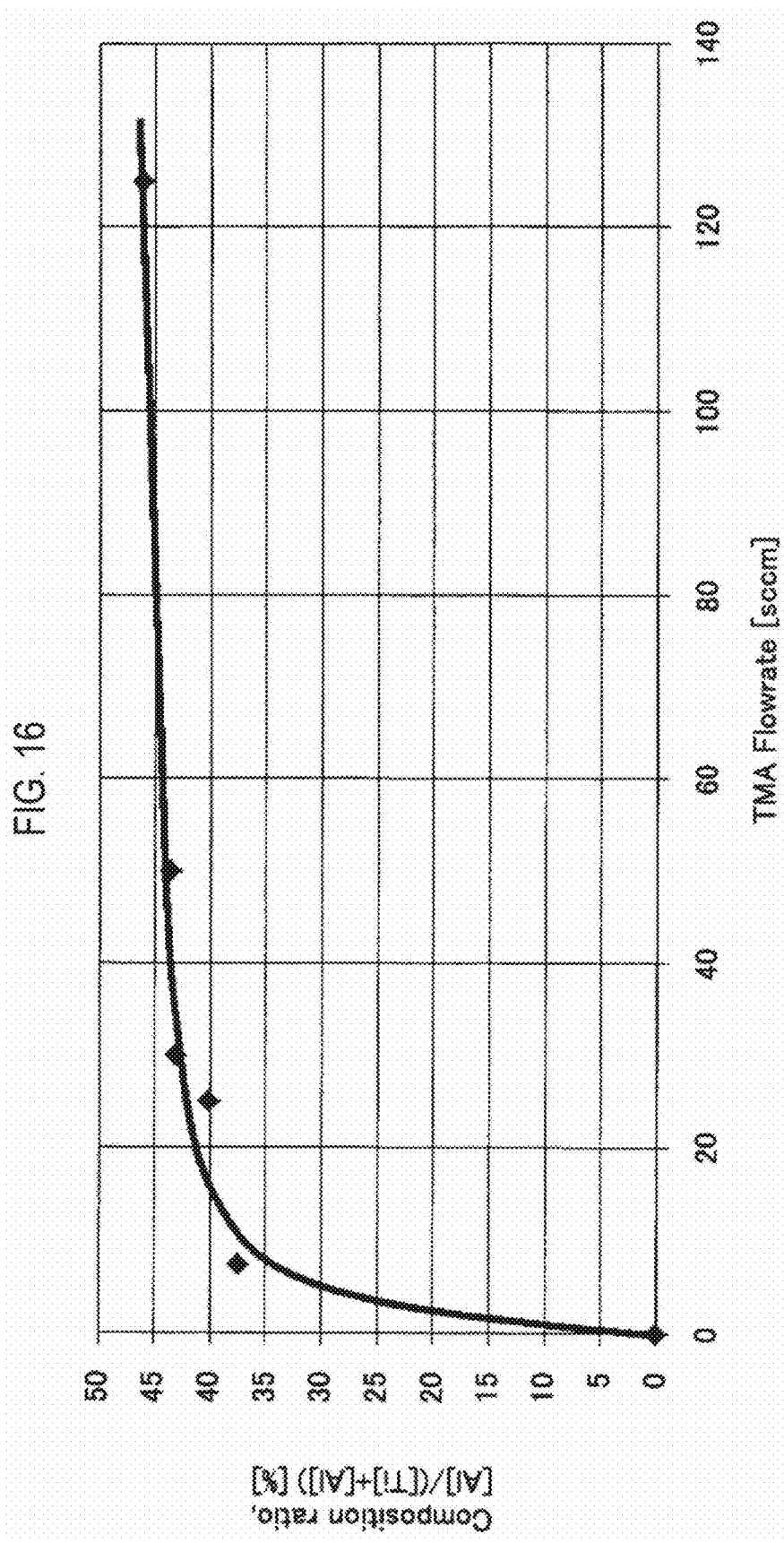
FIG. 16 is a view illustrating dependency of an amount of Al in a TiAlO film on a TMA flow rate in the film forming method according to an embodiment of the present disclosure.

FIG. 16 is a view illustrating dependency of an amount of Al in a TiAlO film on TMA flow rate. The horizontal axis indicates a flow rate of the TMA gas and the vertical axis indicates a mixing ratio of the Al element to the total amount of Ti element and Al element in the TiAlO film ([Al]/([Ti]+[Al])). Further, the flow rate of $TiCl_4$ was set to 50 sccm.

As illustrated in FIG. 16, the flow rate of TMA gas varied in the widened range of 0 to 130 sccm, and the mixing ratio of Al in the TiAlO film showed a range of 41 to 45% when the TMA gas flow rate was in the range of 20 to 80 sccm, and showed a range of 45 to 47% even when the TMA gas flow rate was in the range of 80 to 130 sccm. That is, the mixing ratio of Al in the TiAlO film showed a substantially uniform range of about 41 to 47%, regardless of change in the flow rate of TMA.

Thus, it can be noted that the film forming method according to the present embodiment can be performed regardless of the level of the TMA gas flow rate.

While the example in which the TiAlO film is formed by using the $TiCl_4$ gas containing a metal element Ti as a first source gas and the TMA gas containing a metal element Al as a second source gas has been described above, the present disclosure can be applied even to a combination of other metals. Moreover, the present disclosure can be applicable to various combinations as long as the combinations are combinations of alloy and nonmetal elements such as a nitride film, a bromide film, and a carbide film, as well as an oxide film.

According to the present disclosure in some embodiments, it is possible to form a film with a surface not crystallized and having low surface roughness.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method, comprising:
    supplying a first source gas containing a first metal element onto a substrate;
    supplying a second source gas containing a second metal element onto the substrate;
    supplying a reaction gas converted into plasma and containing a nonmetal element reacting with the first metal element and the second metal element to generate a first reaction product and a second reaction product, respectively, to the substrate, to generate a third reaction product containing the first metal element, the second metal element and the nonmetal element,
    wherein a mixing ratio of the first metal element contained in the third reaction product is higher than that of the second metal element, and a crystallization temperature of the second reaction product is higher than that of the first reaction product, and
    wherein the substrate is loaded on a rotary table, the supplying a first source gas and the supplying a second source gas are simultaneously performed in a first process region, and the supplying a reaction gas is performed in a second process region to which the substrate can move from the first process region by rotation of the rotary table.

2. The method of claim 1, wherein the first reaction product is easier in processing than the second reaction product.

3. The method of claim 2, wherein the processing is etching processing.

4. The method of claim 1, wherein the nonmetal element is any one of oxygen, nitrogen, bromine, and carbon.

5. The method of claim 1, wherein a temperature of the substrate is set to a predetermined substrate temperature lower than the crystallization temperature of the first reaction product.

6. The method of claim 5, wherein the second metal element is an element which is not crystallized at the predetermined substrate temperature even when the crystallization temperature of the second reaction product is substantially lowered through the conversion into plasma.

7. The method of claim 1, wherein the supplying a first source gas and the supplying a second source gas that are performed in the first process region, and the supplying a reaction gas performed in the second process region are continuously and alternately repeated via the continuous rotation of the rotary table.

8. The method of claim 7, wherein the first process region and the second process region are formed to be spaced apart from each other along a rotational direction of the rotary table and a separation region is formed to supply an inert gas between the first process region and the second process region, and
    wherein the method further comprises supplying an inert gas to the substrate between the supplying a first source gas and the supplying a second source gas, and the supplying a reaction gas.

9. The method of claim 1, wherein the first source gas and the second source gas are separately supplied from different gas supply units, respectively.

10. The method of claim 1, wherein the first source gas is a titanium tetrachloride ($TiCl_4$) gas containing Ti, the second source gas is a trimethylaluminum (TMA) gas containing Al, and the reaction gas is an oxidizing gas.

11. The method of claim 1, wherein the third reaction product can be used as a hard mask for patterning.

* * * * *